United States Patent
Jeng et al.

(10) Patent No.: US 11,764,159 B2
(45) Date of Patent: Sep. 19, 2023

(54) PACKAGE WITH FAN-OUT STRUCTURES

(71) Applicant: TAIWAN SEMICONDUCTOR MANUFACTURING COMPANY, LTD., Hsinchu (TW)

(72) Inventors: Shin-Puu Jeng, Po-Shan Village (TW); Po-Hao Tsai, Taoyuan (TW); Po-Yao Chuang, Hsinchu (TW); Techi Wong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 17/358,987

(22) Filed: Jun. 25, 2021

(65) Prior Publication Data
US 2021/0320069 A1 Oct. 14, 2021

Related U.S. Application Data

(63) Continuation of application No. 15/874,374, filed on Jan. 18, 2018, now Pat. No. 11,322,449.
(Continued)

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/486* (2013.01); *H01L 21/4853* (2013.01);
(Continued)

(58) Field of Classification Search
CPC ............... H01L 21/568; H01L 21/4857; H01L 23/5383; H01L 23/5389
See application file for complete search history.

(56) References Cited

U.S. PATENT DOCUMENTS 7,545,047 B2  6/2009  Bauer et al.
7,838,337 B2  11/2010  Marimuthu et al.
(Continued)

FOREIGN PATENT DOCUMENTS

CN  101632168 A  1/2010
CN  105789147 A1  7/2016
(Continued)

OTHER PUBLICATIONS

Chinese Office Action dated Feb. 3, 2020 issued in corresponding Chinese Application No. 201810730689.1.
(Continued)

*Primary Examiner* — Tuan A Hoang
(74) *Attorney, Agent, or Firm* — Birch, Stewart, Kolasch & Birch, LLP

(57) ABSTRACT

Structures and formation methods of chip packages are provided. The method includes disposing a semiconductor die over a carrier substrate. The method also includes disposing an interposer substrate over the carrier substrate. The interposer substrate has a recess that penetrates through opposite surfaces of the interposer substrate. The interposer substrate has interior sidewalls surrounding the semiconductor die, and the semiconductor die is as high as or higher than the interposer substrate. The method further includes forming a protective layer in the recess of the interposer substrate to surround the semiconductor die. In addition, the method includes removing the carrier substrate and stacking a package structure over the interposer substrate.

20 Claims, 45 Drawing Sheets

Related U.S. Application Data

(60) Provisional application No. 62/579,278, filed on Oct. 31, 2017.

(51) Int. Cl.
| | |
|---|---|
| *H01L 25/10* | (2006.01) |
| *H01L 23/00* | (2006.01) |
| *H01L 21/48* | (2006.01) |
| *H01L 21/56* | (2006.01) |
| *H01L 25/00* | (2006.01) |
| *H01L 23/16* | (2006.01) |
| *H01L 21/683* | (2006.01) |

(52) U.S. Cl.
CPC .......... *H01L 21/4857* (2013.01); *H01L 21/56* (2013.01); *H01L 21/563* (2013.01); *H01L 21/565* (2013.01); *H01L 21/568* (2013.01); *H01L 21/6835* (2013.01); *H01L 23/16* (2013.01); *H01L 23/3114* (2013.01); *H01L 23/3128* (2013.01); *H01L 23/5383* (2013.01); *H01L 23/5384* (2013.01); *H01L 23/5386* (2013.01); *H01L 24/19* (2013.01); *H01L 24/20* (2013.01); *H01L 25/105* (2013.01); *H01L 25/50* (2013.01); *H01L 24/13* (2013.01); *H01L 24/16* (2013.01); *H01L 2221/68345* (2013.01); *H01L 2221/68381* (2013.01); *H01L 2224/11462* (2013.01); *H01L 2224/11464* (2013.01); *H01L 2224/13082* (2013.01); *H01L 2224/13111* (2013.01); *H01L 2224/13147* (2013.01); *H01L 2224/16225* (2013.01); *H01L 2224/214* (2013.01); *H01L 2224/73204* (2013.01); *H01L 2224/73253* (2013.01); *H01L 2224/81001* (2013.01); *H01L 2224/92125* (2013.01); *H01L 2225/1035* (2013.01); *H01L 2225/1058* (2013.01); *H01L 2924/1203* (2013.01); *H01L 2924/1304* (2013.01); *H01L 2924/15311* (2013.01); *H01L 2924/15321* (2013.01); *H01L 2924/181* (2013.01)

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,601,461 B2 | 3/2017 | Ho et al. | |
| 2010/0133704 A1* | 6/2010 | Marimuthu | H01L 23/3128 |
| | | | 257/E23.116 |
| 2010/0200975 A1* | 8/2010 | Chino | H01L 21/6835 |
| | | | 257/E25.027 |
| 2011/0240357 A1 | 10/2011 | Kariya et al. | |
| 2013/0075936 A1 | 3/2013 | Lin et al. | |
| 2014/0048906 A1 | 2/2014 | Shim et al. | |
| 2014/0070396 A1 | 3/2014 | Kyozuka et al. | |
| 2014/0264811 A1 | 9/2014 | Wu | |
| 2015/0028478 A1 | 1/2015 | Meyer et al. | |
| 2015/0062848 A1 | 3/2015 | Lee et al. | |
| 2015/0187742 A1 | 7/2015 | Kwon et al. | |
| 2015/0235993 A1 | 8/2015 | Cheng et al. | |
| 2016/0300815 A1 | 10/2016 | Kim | |
| 2016/0336296 A1 | 11/2016 | Jeong et al. | |
| 2016/0358894 A1 | 12/2016 | Yu et al. | |
| 2017/0040265 A1* | 2/2017 | Park | H01L 25/105 |
| 2017/0178984 A1* | 6/2017 | Ko | H01L 22/14 |
| 2017/0178992 A1 | 6/2017 | Jeong et al. | |
| 2017/0243826 A1* | 8/2017 | Lin | H01L 21/4853 |
| 2017/0358535 A1 | 12/2017 | Yoo et al. | |

FOREIGN PATENT DOCUMENTS

| | | |
|---|---|---|
| KR | 10-2016-0132763 A | 11/2016 |
| KR | 10-2016-0134435 A | 11/2016 |
| KR | 10-2017-0074080 A | 6/2017 |
| KR | 10-2017-0074096 A | 6/2017 |
| TW | 201342502 A | 10/2013 |
| TW | 201526125 A | 7/2015 |
| TW | 201712828 A | 4/2017 |

OTHER PUBLICATIONS

Korean Office Action dated Aug. 20, 2019, for corresponding Korean Application No. 10-2018-0077031.

* cited by examiner

PACKAGE WITH FAN-OUT STRUCTURES

PRIORITY CLAIM AND CROSS-REFERENCE

This Application is a Continuation application of U.S. application Ser. No. 15/874,374, filed on Jan. 18, 2018, which claims the benefit of U.S. Provisional Application No. 62/579,278, filed on Oct. 31, 2017, the entirety of which are incorporated by reference herein.

BACKGROUND

Semiconductor devices are used in a variety of electronic applications, such as personal computers, cell phones, digital cameras, and other electronic equipment. The semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes a smaller area or a lower height, in some applications.

New packaging technologies, such as package on package (PoP), have begun to be developed, in which a top package with a device die is bonded to a bottom package, with another device die. By adopting these new packaging technologies, various packages with different or similar functions may be integrated together. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
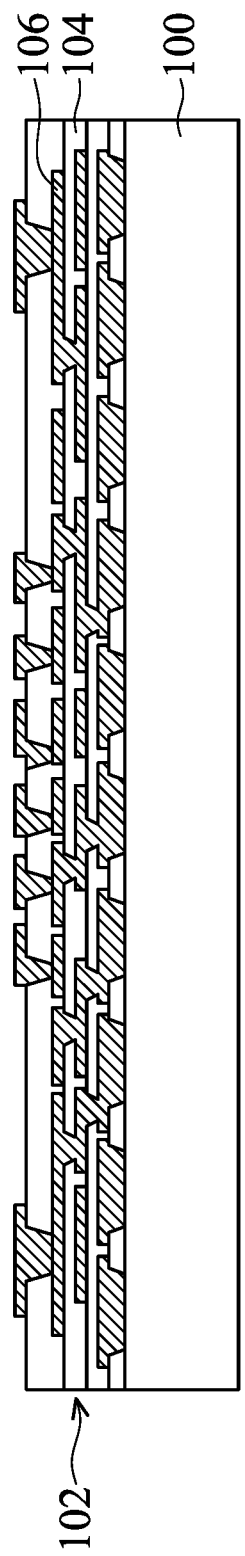
FIGS. 1A-1K are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1K are cross-sectional views of various stages of a process for forming a chip package, in accordance with some embodiments. As shown in FIG. 1A, a carrier substrate 100 is provided or received. The carrier substrate 100 may be used as a temporary support substrate during subsequent formation processes. The carrier substrate 100 may include an insulating substrate, a semiconductor substrate, a conductive substrate, one or more other suitable substrates, or a combination thereof. In some embodiments, the carrier substrate 100 is a glass substrate, such as a glass wafer. In some other embodiments, the carrier substrate 100 is a semiconductor substrate, such as a silicon wafer. In some other embodiments, the carrier substrate 100 is a support frame, such as a metal frame.

As shown in FIG. 1A, an interconnection structure 102 is formed over the carrier substrate 100, in accordance with some embodiments. The interconnection structure 102 may be used as a redistribution structure for routing. The interconnection structure 102 includes multiple insulating layers 104 and multiple conductive features 106, as shown in FIG. 1A. In some embodiments, some of the conductive features 106 are exposed at or protruding from the top surface of the top of the insulating layers 104. The exposed or protruding conductive features 106 may serve as bonding pads where conductive bumps (such as tin-containing solder bumps) and/or conductive pillars (such as copper pillars) will be formed later.

The insulating layers 104 may be made of or include one or more polymer materials. The polymer material(s) may include polybenzoxazole (PBO), polyimide (PI), one or more other suitable polymer materials, or a combination thereof. In some embodiments, the polymer material is photosensitive. In some embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof. The conductive features 106 may include conductive lines providing electrical connection in horizontal directions and conductive vias providing electrical connection in vertical directions. The conductive features 106 may be made of or include copper, aluminum, gold, cobalt, titanium, graphene, one or more other suitable conductive materials, or a combination thereof.

The formation of the interconnection structure 102 may involve multiple deposition or coating processes, multiple patterning processes, and/or multiple planarization processes. The deposition or coating processes may be used to form insulating layers and/or conductive layers. The deposition or coating processes may include a spin-on process, an electroplating process, an electroless process, a chemical vapor deposition process, a physical vapor deposition process, one or more other applicable processes, or a combination thereof. The patterning processes may be used to pattern the formed insulating layers and/or the formed conductive layers. The patterning processes may include a photolithography process, an energy beam drilling process, an etching process, a mechanical drilling process, one or more other applicable processes, or a combination thereof. The planarization processes may be used to provide the formed insulating layers and/or the formed conductive layers with planar top surfaces. The planarization processes may include a mechanical grinding process, a chemical mechanical polishing (CMP) process, one or more other applicable processes, or a combination thereof.

However, many variations and/or modifications can be made to embodiments of the disclosure. In some other embodiments, the interconnection structure 102 is not formed.

Figure 1B:
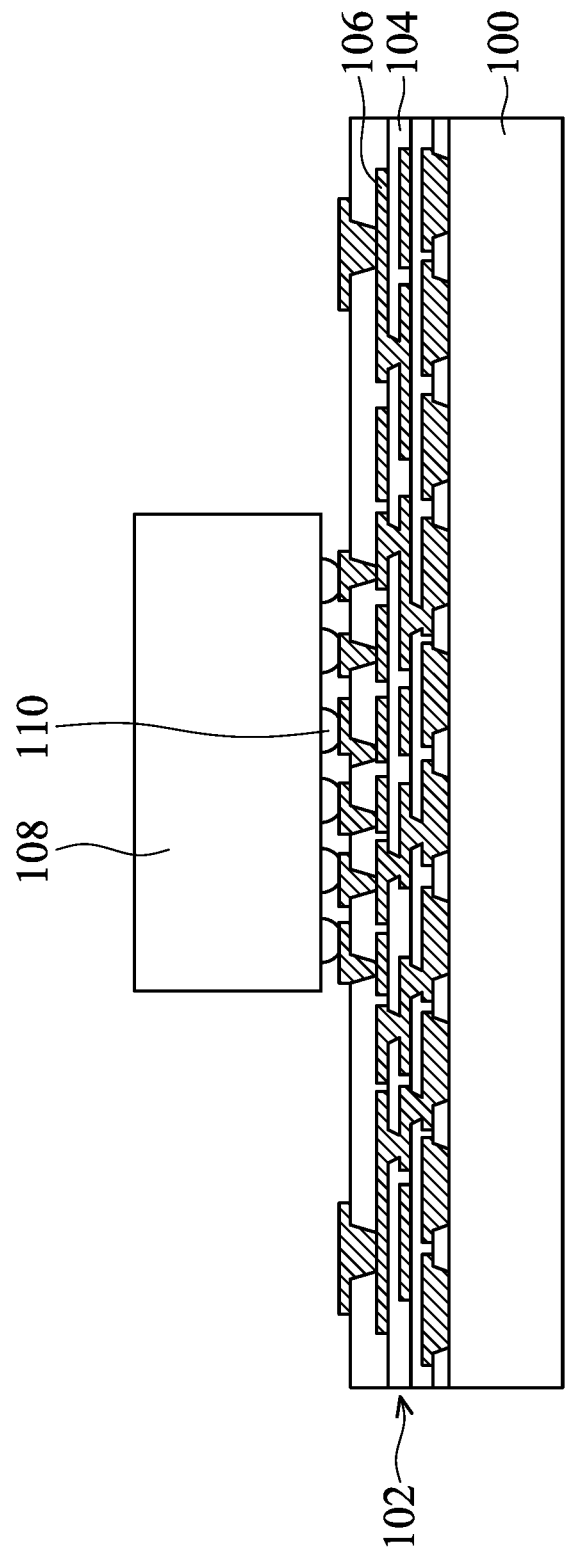

As shown in FIG. 1B, a semiconductor device such as a semiconductor die 108 is disposed over the carrier substrate 100, in accordance with some embodiments. The semiconductor device may include one die, multiple dies, or system-on-integrated-circuit chip device. In some embodiments, multiple semiconductor dies 108 are disposed over the carrier substrate 100. The semiconductor die 108 may be a system-on-chip (SoC) chip. In some other embodiments, the element 108 is a system on integrated circuit (SoIC) device that includes two or more chips with integrated function. In these cases, the reference number "108" is used to designate a semiconductor device. In some embodiments, the semiconductor die 108 is disposed over the interconnection structure 102 formed over the carrier substrate 100. In some embodiments, the semiconductor die 108 is bonded to some of the conductive features 106 of the interconnection structure 102 through bonding structures 110.

In some embodiments, the bonding structures 110 are electrically conductive. Electrical connection between device elements in the semiconductor die 108 and some of the conductive features 106 of the interconnection structure 102 may be formed through the bonding structures 110. In some embodiments, the bonding structures 110 are or include solder bumps such as tin-containing solder bumps. The tin-containing solder bumps may further include copper, silver, gold, aluminum, lead, one or more other suitable materials, or a combination thereof. In some embodiments, the tin-containing solder bump is lead free. The formation of the bonding structures 110 may involve one or more reflow processes and/or one or more plating processes.

In some embodiments, the bonding structures 110 include metal pillars such as copper pillars. The formation of the bonding structures 110 may involve an electroplating process or an electroless plating process. In some embodiments, tin-containing solder materials may be formed between the bonding structures 110 and some of the conductive features 106 of the interconnection structure 102.

Figure 1C:
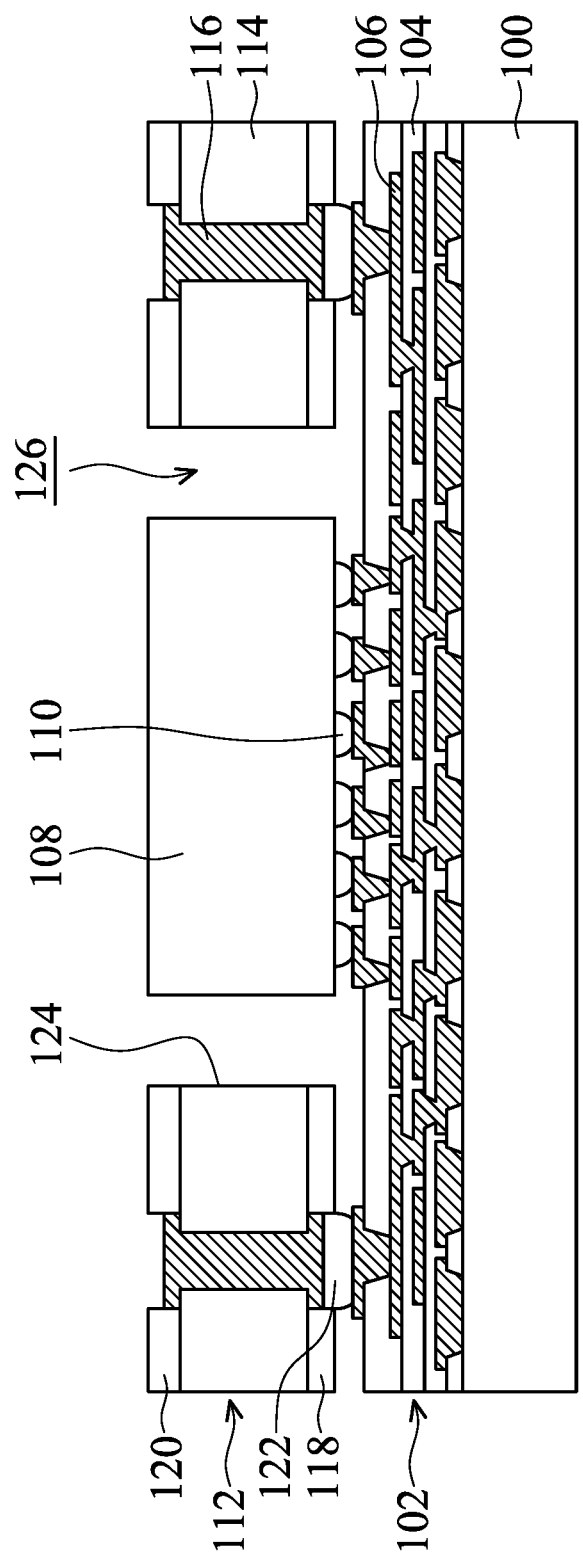

As shown in FIG. 1C, an interposer substrate 112 is disposed over the carrier substrate 100, in accordance with some embodiments. In some embodiments, the interposer substrate 112 is disposed over the interconnection structure 102 formed on the carrier substrate 100. In some embodiments, the interposer substrate 112 is bonded to some of the conductive features 106 of the interconnection structure 102 through bonding structures 122. The materials and formation methods of the bonding structures 122 may be the same as or similar to those of the bonding structures 110.

In some embodiments, the interposer substrate 112 includes a base portion 114 and multiple conductive features 116. The base portion 114 may be made of or include one or more insulating materials, one or more semiconductor materials, one or more other suitable materials, or a combination thereof. In some embodiments, the base portion 114 includes a polymer material (such as an epoxy-based resin) with fillers dispersed therein. In some embodiments, the fillers may include fibers such as glass fibers. In some embodiments, the base portion 114 is a stack of multiple insulating layers.

In some embodiments, the conductive features 116 include conductive structures that penetrate through opposite surfaces of the base portion 114. In some other embodiments, the conductive features 116 include multiple conductive vias and conductive lines. In some other embodiments, the base portion 114 is made of a semiconductor material such as silicon. In these cases, an insulating layer (not shown) is formed between the base portion 114 and the conductive features 116.

In some embodiments, the interposer substrate 112 includes passivation layers 118 and 120 formed on opposite surfaces of the base portion 114. In some embodiments, the passivation layers 118 and 120 have openings that expose some of the conductive features 116. For example, the exposed conductive features 116 may be conductive pads. In some embodiments, the bonding structures 122 partially cover the passivation layer 118.

Figure 8:
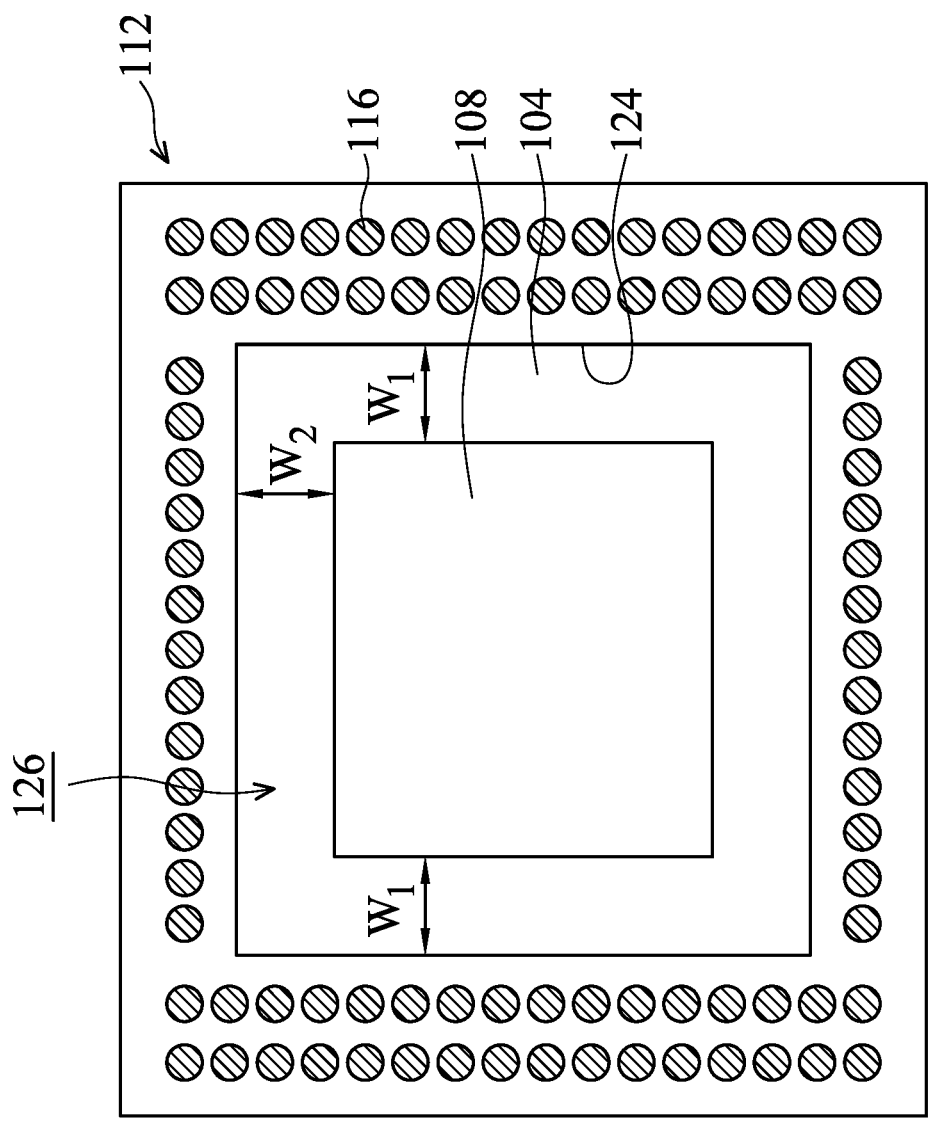
FIG. 8 is a top view of a stage of a process for forming a chip package, in accordance with some embodiments.

FIG. 8 is a top view of a stage of a process for forming a chip package, in accordance with some embodiments. In some embodiments, FIG. 8 shows the top view of the structure shown in FIG. 1C. In some embodiments, the interposer substrate 112 is a ring structure that has a recess 126, as shown in FIGS. 1C and 8. The recess 126 penetrates through opposite surfaces of the interposer substrate 112. As shown in FIGS. 1C and 8, the interposer substrate 112 has a ring shape and has multiple interior sidewalls 124. The interior sidewalls 124 surround the recess 126. The interior sidewalls 124 also surround the semiconductor die 108.

In some embodiments, the recess 126 is wider than the semiconductor die 108. In some embodiments, the recess 126 exposes a portion of the interconnection structure 102. For example, the top surface of the insulating layers 104 is exposed by the recess 126.

As shown in FIG. 8, the semiconductor die 108 has a first edge that is separated from the corresponding nearest interior sidewall 124 by a distance $W_1$. The semiconductor die 108 has a second edge that is separated from the corresponding nearest interior sidewall 124 by a distance $W_2$. In some embodiments, the distances $W_1$ and $W_2$ are substantially the same. The distance $W_1$ may be in a range from about 20 μm to about 400 μm. In some other embodiments, the distance $W_1$ is in a range from about 400 μm to about 1500 μm. In some other embodiments, the distances $W_1$ and $W_2$ are different from each other.

In some embodiments, the top view of the recess 126 has rectangular shape, as shown in FIG. 8. In some other embodiments, the top view of the recess 126 has a shape other than rectangular shape. The shape of the top view of the recess 126 may include square, oval, circle, or another suitable shape.

In some embodiments, the semiconductor die 108 is higher than the interposer substrate 112. The top surface of the semiconductor die 108 is positioned at a higher level than the top surface of the interposer substrate 112. In some other embodiments, the semiconductor die 108 is as high as the interposer substrate 112. The top surfaces of the semiconductor die 108 and the interposer substrate 112 are positioned at the same height level.

Many variations and/or modifications can be made to embodiments of the disclosure. Although the interposer substrate 112 is disposed over the interconnection structure 102 after the disposal of the semiconductor die 108, embodiments of the disclosure are not limited thereto. In some other embodiments, the interposer substrate 112 is disposed over the interconnection structure 102 before the semiconductor die 108 is disposed. For example, an interposer substrate having multiple recesses is disposed first. Afterwards, semiconductor dies are disposed over the interconnection structures. Each of the semiconductor dies may be picked and placed onto a corresponding area of the interconnection structure surrounded by the recesses.

Figure 1D:
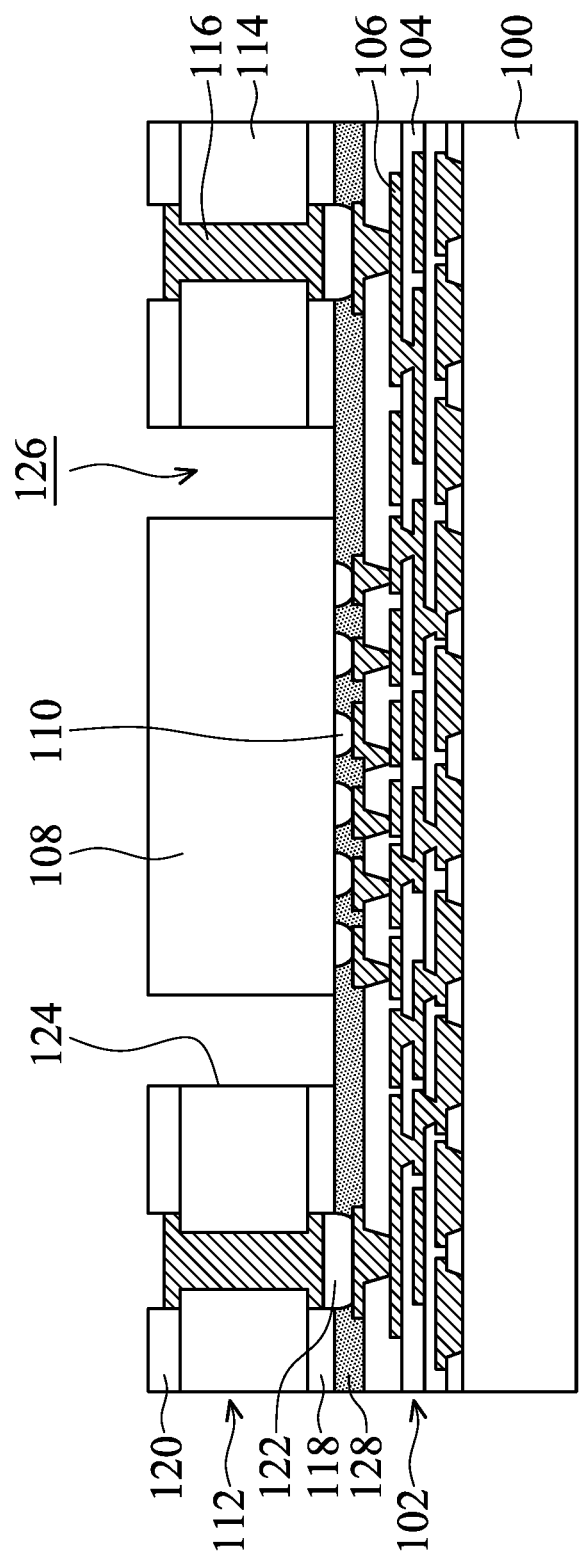

As shown in FIG. 1D, an underfill layer 128 is formed between the semiconductor die 108 and the interconnection structure 102, in accordance with some embodiments. The underfill layer 128 surrounds and protects the bonding structures 110. In some embodiments, the underfill layer 128 is in direct contact with the bonding structures 110. In some embodiments, the underfill layer 128 extends laterally towards the bonding structures 122. In some embodiments, the underfill layer 128 also surrounds and protects the bonding structures 122. In some embodiments, the underfill layer 128 is in direct contact with the bonding structures 122.

In some embodiments, the underfill layer 128 is made of or includes a polymer material. The underfill layer 128 may include an epoxy-based resin. In some embodiments, the underfill layer 128 includes fillers dispersed in the epoxy-based resin. In some embodiments, the underfill layer 128 is softer than the base portion 114 of the interposer substrate 112. In some embodiments, the base portion 114 has a greater concentration of fillers than that of the underfill layer 128. In some embodiments, each of the fillers in the base portion 114 is longer than each of the fillers in the underfill layer 128. For example, the fillers in the base portion 114 are fibers, and the fillers in the underfill layer 128 are particles. In some embodiments, the formation of the underfill layer 128 involves an injecting process, a spin-on process, a dispensing process, a film lamination process, an application process, one or more other applicable processes, or a combination thereof. In some embodiments, a thermal curing process is used during the formation of the underfill layer 128.

Figure 1E:
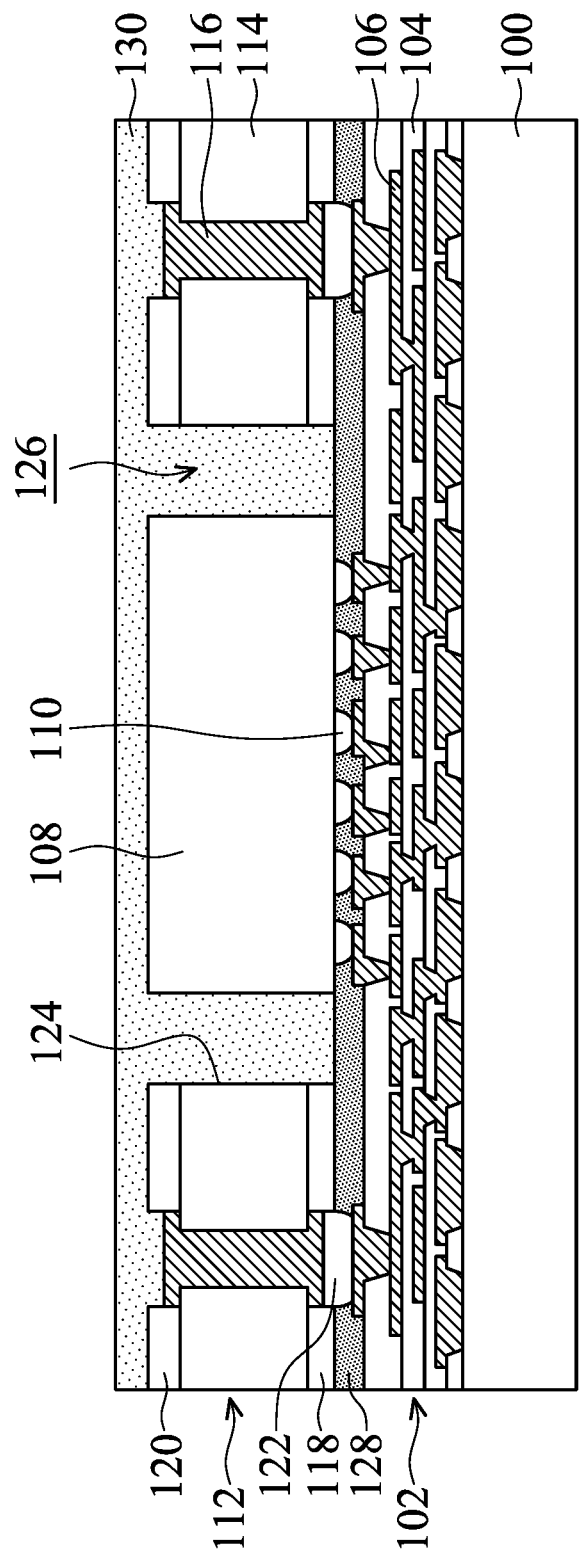

As shown in FIG. 1E, a protective layer 130 is formed over the structure shown in FIG. 1D, in accordance with some embodiments. In some embodiments, the protective layer 130 extends into the recess 126 to surround and protect the semiconductor die 108. In some embodiments, the protective layer 130 is in direct contact with the semiconductor die 108. In some embodiments, the protective layer 130 is in direct contact with the interposer substrate 112. In some embodiments, the protective layer 130 is made of or includes a molding compound material. The molding compound material may include a polymer material, such as an epoxy-based resin with fillers dispersed therein. In some embodiments, the protective layer 130 is softer than the base portion 114 of the interposer substrate 112. In some embodiments, the base portion 114 has a greater concentration of fillers than that of the protective layer 130. In some embodiments, each of the fillers in the base portion 114 is longer than each of the fillers in the protective layer 130. For example, the fillers in the base portion 114 are fibers, and the fillers in the protective layer 130 are particles.

In some embodiments, a liquid molding compound material is applied over the interposer substrate 112 and the semiconductor die 108. The liquid molding compound material may flow into the recess 126 to encapsulate the semiconductor die 108. A thermal process is then used to cure the liquid molding compound material and to transform it into the protective layer 130.

Figure 1F:
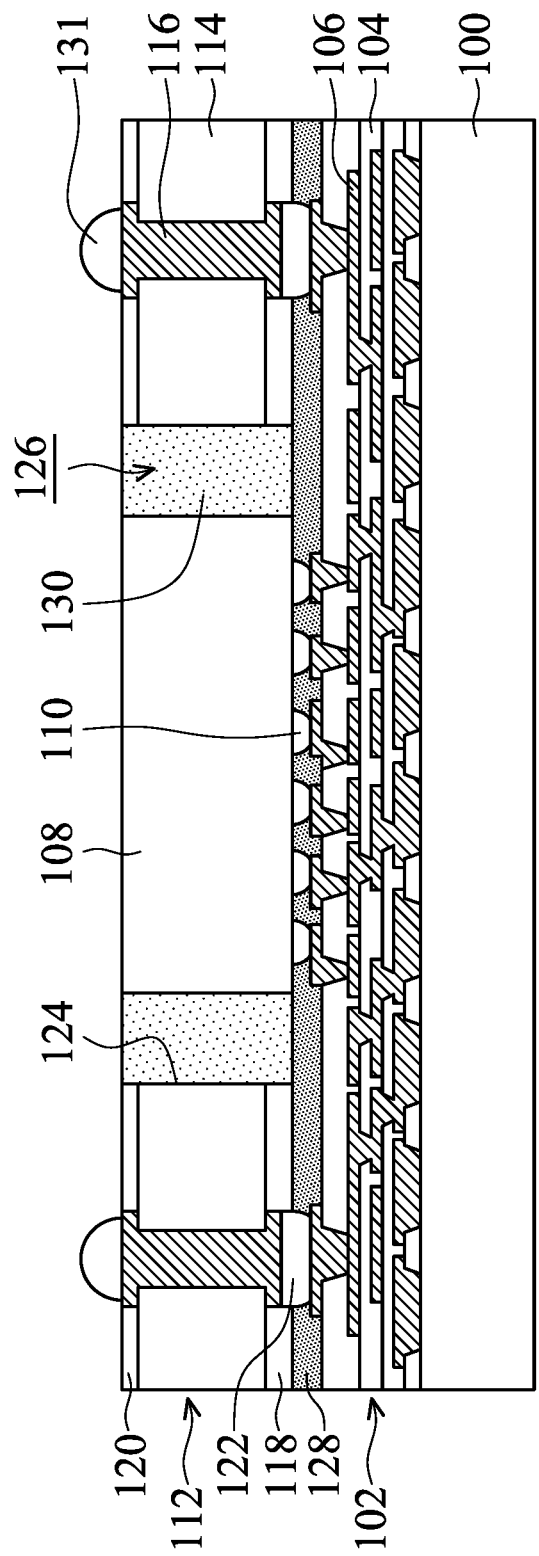

As shown in FIG. 1F, the protective layer 130 is thinned to expose the conductive features 116, in accordance with some embodiments. In some embodiments, the passivation layer 120 is also exposed after the protective layer 130 is thinned. The protective layer 130 may be thinned using a mechanical grinding process. In some other embodiments, the protective layer 130 is formed using an exposed molding process or a dispensing process. In the exposed molding process, the conductive features 116 are protected by a mold during the injecting of molding compound material for forming the protective layer 130. The protective layer would not cover the conductive features 116. In these cases, the thinning process may not be performed since the conductive features 116 have been exposed.

Afterwards, conductive elements 131 are formed over the conductive features 116 of the interposer substrate 112, as shown in FIG. 1F in accordance with some embodiments. In some embodiments, the conductive elements 131 are solder bumps. In some embodiments, the conductive elements 131 are or include tin-containing solder bumps. The tin-containing solder bumps may further include copper, silver, gold, aluminum, lead, one or more other suitable materials, or a combination thereof. In some embodiments, the tin-containing solder bump is lead free. The formation of the conductive elements 131 may involve one or more reflow processes and/or one or more plating processes.

Many variations and/or modifications can be made to embodiments of the disclosure. In some other embodiments, the protective layer 130 shown in FIG. 1E is not thinned to expose the conductive features 116. In some embodiments, openings are then formed in the protective layer 130 to expose the conductive features 116. Afterwards, the conductive elements 131 are formed on the exposed conductive features 116. The conductive elements 131 may be completely in the openings formed in the protective layer 130. In these cases, the top surfaces of the conductive elements 131 are below the top surface of the protective layer 130. In some other embodiments, each of the conductive elements 131 has a height greater than the depth of the opening formed in the protective layer 130. In these cases, the conductive elements 131 protrude from the top surface of the protective layer 130.

Many variations and/or modifications can be made to embodiments of the disclosure. In some other embodiments, the conductive elements 131 are formed before the interposer substrate 112 is disposed over the interconnection structure 102.

Figure 1G:
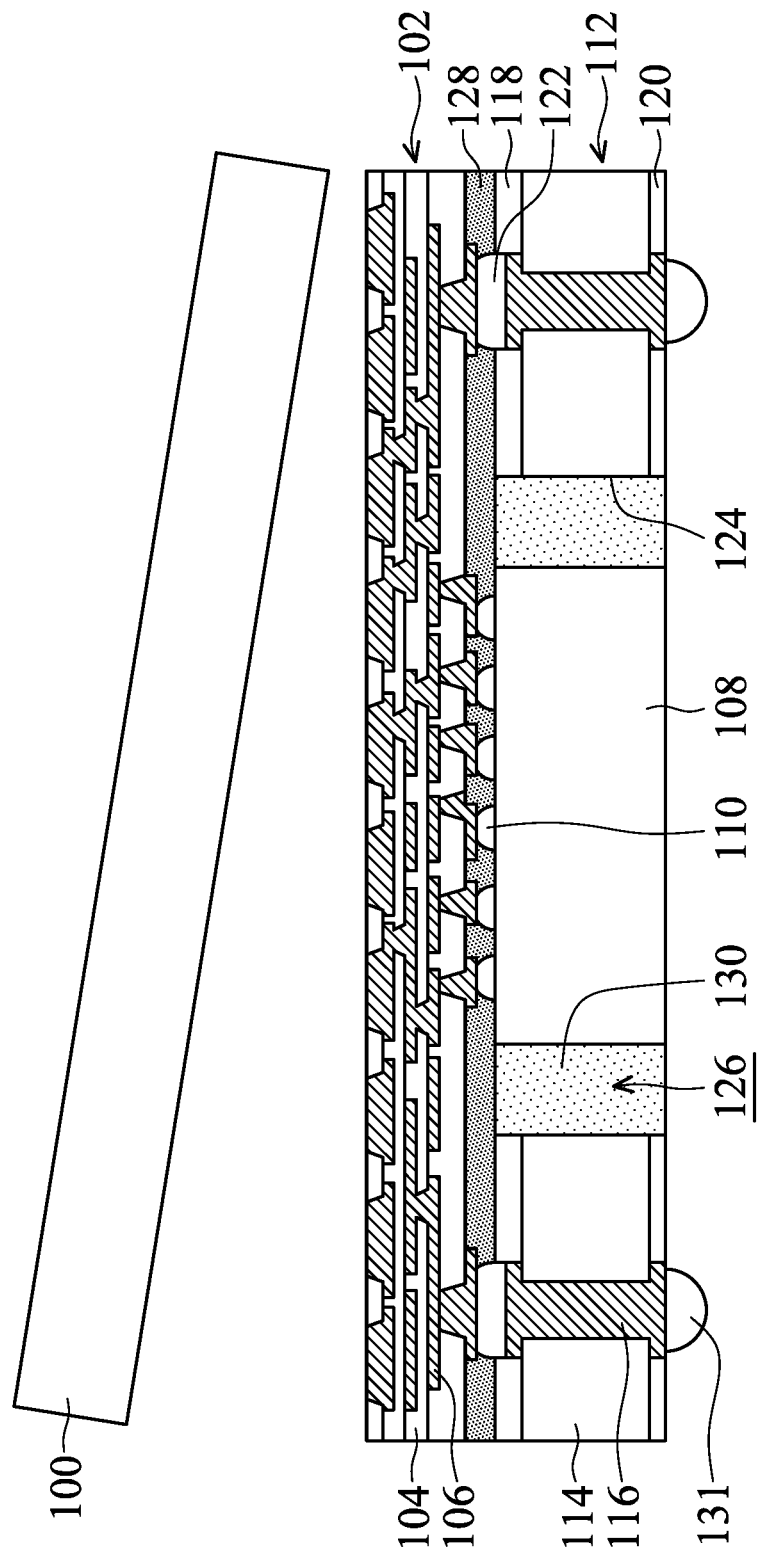

As shown in FIG. 1G, the structure shown in FIG. 1F is flipped upside down, and the carrier substrate 100 is then removed, in accordance with some embodiments. In some embodiments, the structure shown in FIG. 1F is flipped upside down onto a second carrier substrate (not shown) before the removal of the carrier substrate 100. The second carrier substrate may be a carrier tape frame. In some embodiments, some conductive features 106 of the interconnection structure 102 are exposed after the removal of the carrier substrate 100. In some embodiments, the carrier substrate 100 is removed using a light irradiation process, a grinding process, a thermal process, one or more other applicable processes, or a combination thereof. For example, an adhesive layer (not shown) between the carrier substrate 100 and the interconnection structure 102 is detached from the interconnection structure 102 after being irradiated with suitable light. As a result, the carrier substrate 100 is removed.

Figure 1H:
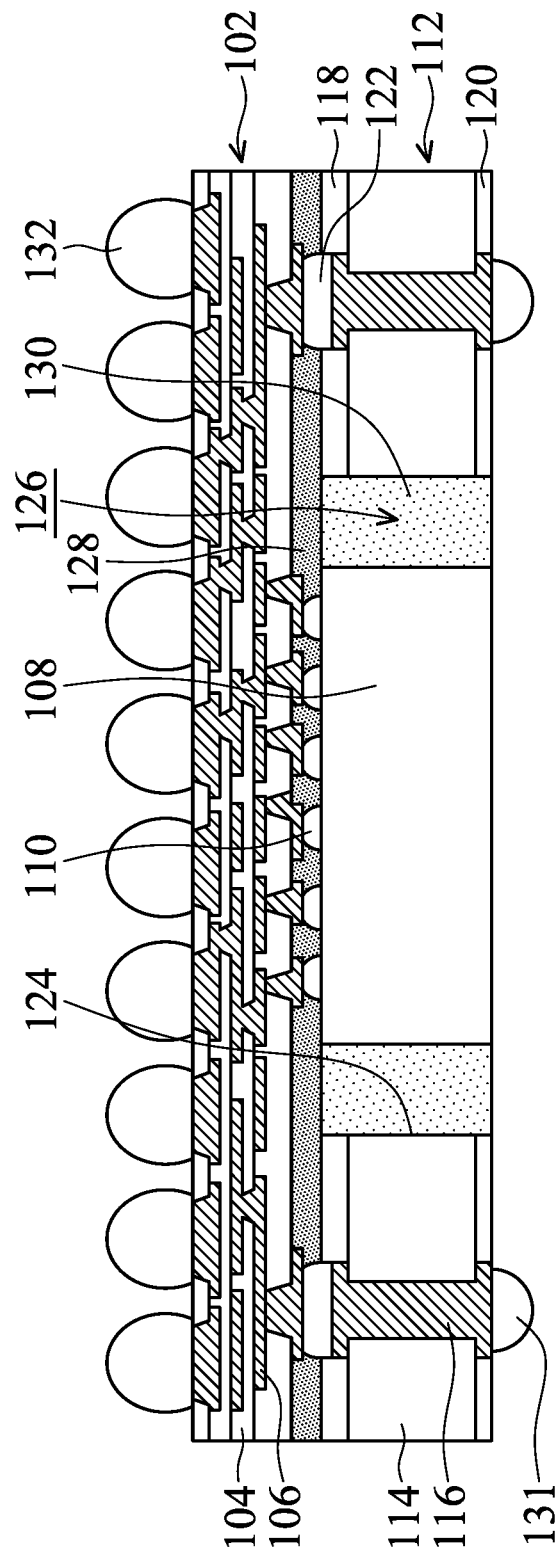

As shown in FIG. 1H, conductive elements 132 are formed over the exposed conductive features 106 of the interconnection structure 102, in accordance with some embodiments. In some embodiments, the conductive elements 132 are solder bumps. The materials and formations methods of the conductive elements 132 may be the same as or similar to those of the conductive elements 131 or the bonding structures 122.

Figure 1I:
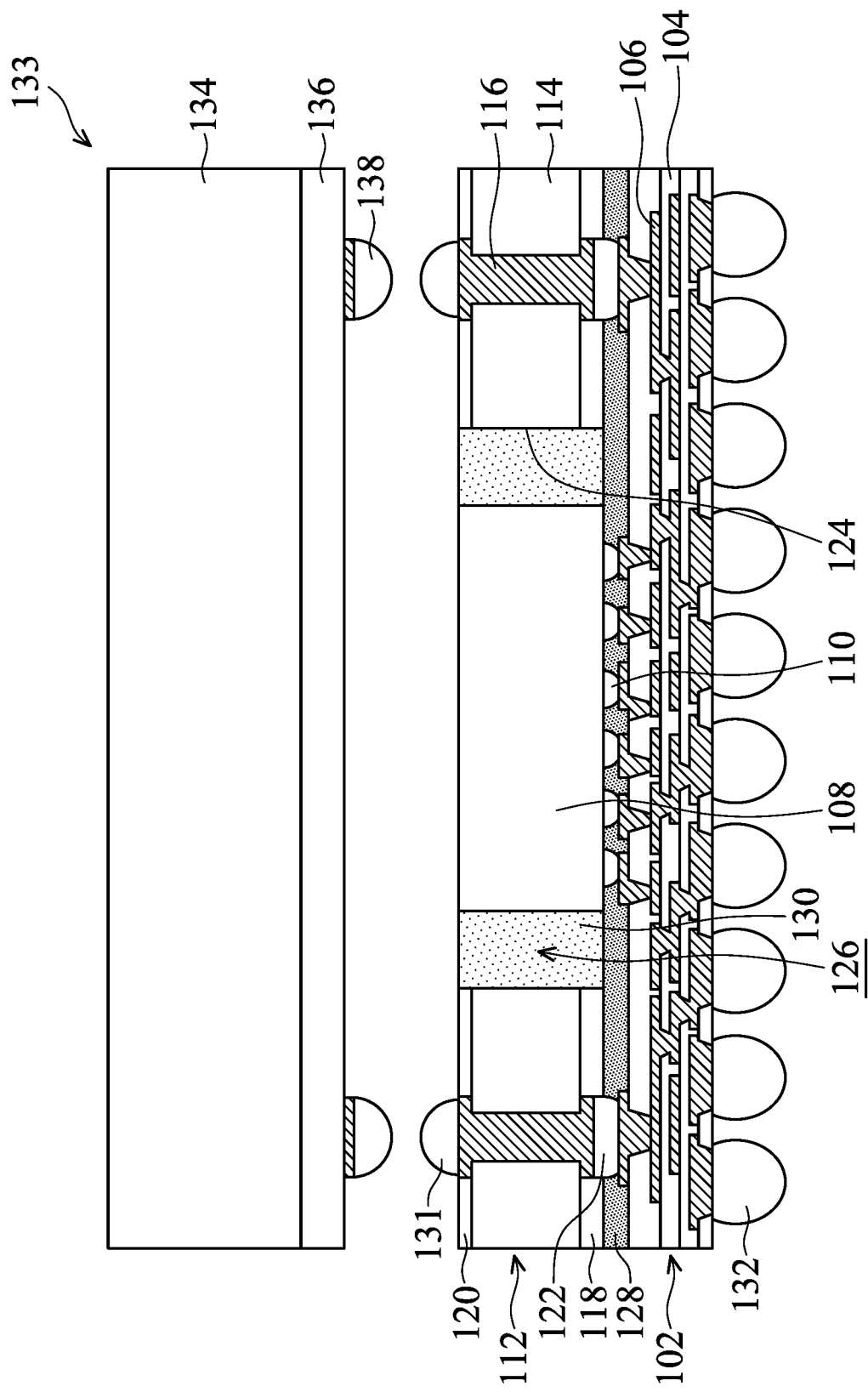

As shown in FIG. 1I, the structure shown in FIG. 1H is flipped upside down to be bonded to a package structure 133, in accordance with some embodiments. In some embodiments, the structure shown in FIG. 1I is sawed to form multiple separated package structures before being bonded to the package structure 133.

The package structure 133 may include an element 134, an interconnection structure 136, and conductive elements 138. In some embodiments, the element 134 is a semiconductor die. The semiconductor die may include multiple dynamic random access memory (DRAM) devices, flash memory devices, static random access memory (SRAM) devices, passive devices, radio frequency module devices, other suitable devices, or a combination thereof. In some embodiments, the element 134 includes a semiconductor die and a package layer encapsulating the semiconductor die. The semiconductor die may include multiple DRAM devices, flash memory devices, SRAM devices, passive devices, radio frequency module devices, other suitable devices, or a combination thereof.

The configurations, materials, and formation methods of the interconnection structure 136 may be the same as or similar to those of the interconnection structure 102. For example, multiple conductive lines and/or conductive vias are included in the interconnection structure 136. The materials and formation methods of the conductive elements 138 may be the same as or similar to those of the conductive elements 132.

Figure 1J:
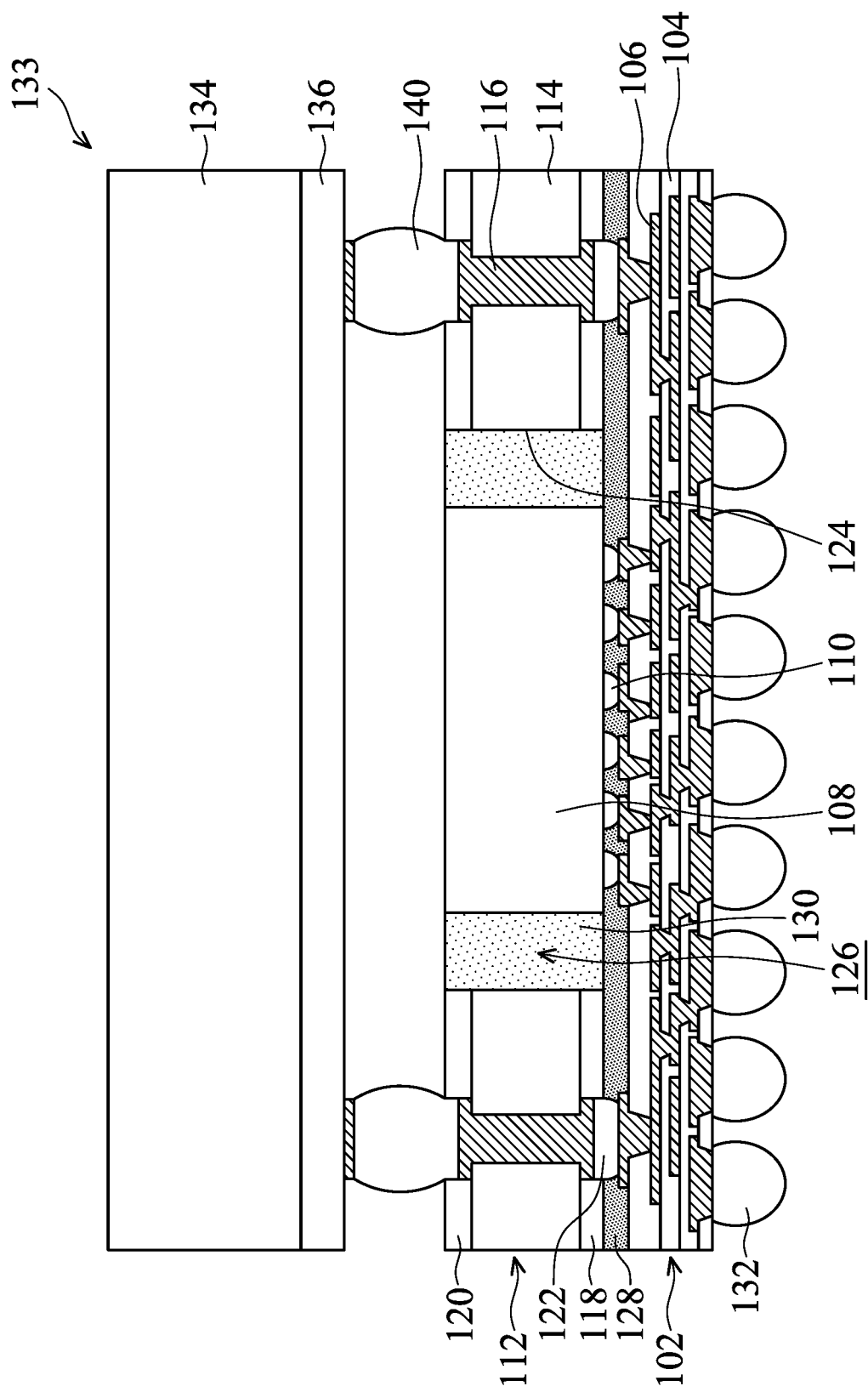

As shown in FIG. 1J, the package structure 133 is stacked and bonded onto the interposer substrate 112, in accordance with some embodiments. In some embodiments, the package structure 133 extends across the semiconductor die 108. In some embodiments, the package structure 133 extends across the protective layer 130 filling the recess 126.

In some embodiments, the package structure 133 and the interposer substrate 112 are bonded together through bonding structures 140. One or more reflow processes may be used to form the bonding structures 140. The conductive elements 131 and 138 (as shown in FIG. 1I) may melt together to form the bonding structure 140 during the reflow process(es) mentioned above. Each of the bonding structures 140 may include a solder material portion and a bonding pad. The bonding pad may be formed between the solder material portion and the interconnection structure 136.

Many variations and/or modifications can be made to embodiments of the disclosure. In some other embodiments, the package structure 133 is not stacked on the interposer substrate 112. In some other embodiments, the package structure 133 is not provided.

Figure 1K:
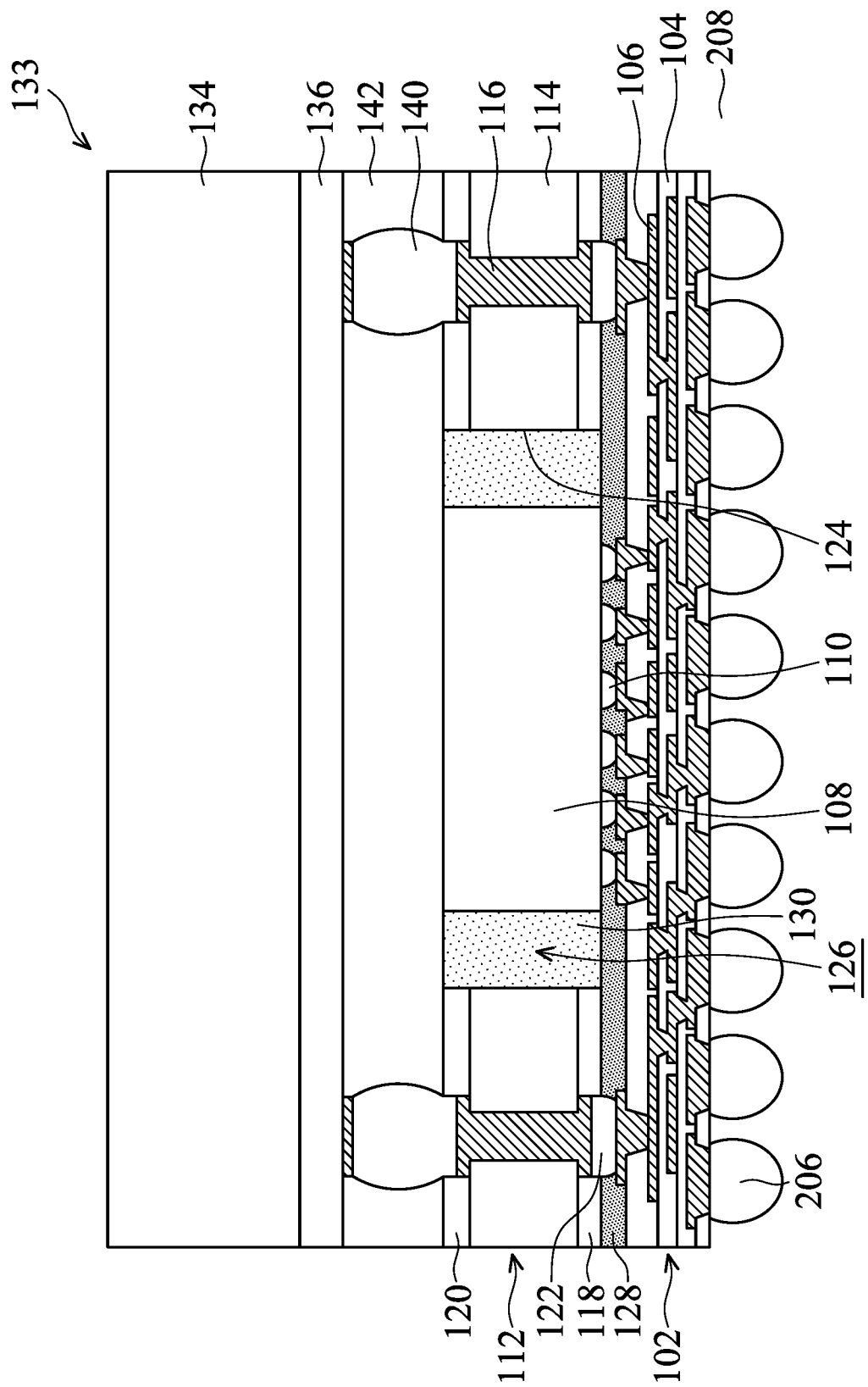

As shown in FIG. 1K, an underfill layer 142 is formed to surround and protect the bonding structures 140. The materials and formation method of the underfill layer 142 may be the same as or similar to those of the underfill layer 128.

Many variations and/or modifications can be made to embodiments of the disclosure. In some other embodiments, the underfill layer 128 is not formed.

Many variations and/or modifications can be made to embodiments of the disclosure. In some other embodiments, the underfill layer 128, the protective layer 130, and the underfill layer 142 are not formed.

Many variations and/or modifications can be made to embodiments of the disclosure. In some other embodiments, a protective material layer is formed after the package structure 133 is bonded to the interposer substrate 112. The protective material layer surrounds the bonding structures 140, the semiconductor die 108, and the bonding structures 122 and 110. In some embodiments, the protective material layer having portions surrounding the bonding structures and the semiconductor die is formed in a single formation process. The portions of the protective material layer surrounding the bonding structures may serve as underfill layers. The portion of the protective material layer surrounding the semiconductor die may serve as a protective layer.

Figure 2A:
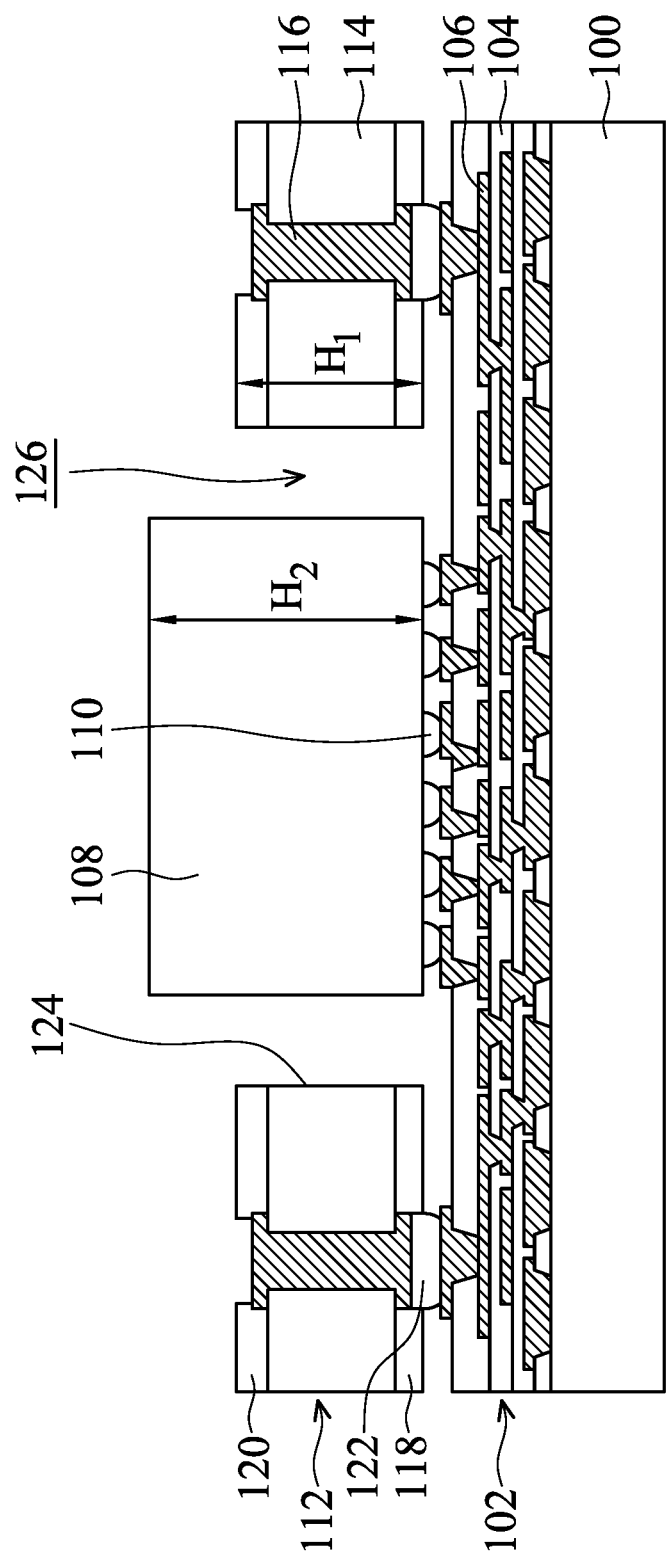
FIGS. 2A-2D are cross-sectional views of various stages of a process for forming a chip package, in accordance with some embodiments.

FIGS. 2A-2D are cross-sectional views of various stages of a process for forming a chip package, in accordance with some embodiments. As shown in FIG. 2A, a structure similar to that shown in FIG. 1C is received or formed. In some embodiments, the semiconductor die 108 is higher than the interposer substrate 112. In some embodiments, the top surface of the semiconductor die 108 is positioned at a higher height level than the top surface of the interposer substrate 112.

As shown in FIG. 2A, the interposer substrate 112 has a height $H_1$, and the semiconductor die has a height $H_2$. In some embodiments, the height $H_2$ is greater than the height $H_1$. The height $H_1$ of the interposer substrate 112 may be in a range from about 20 μm to about 300 μm.

Figure 2B:
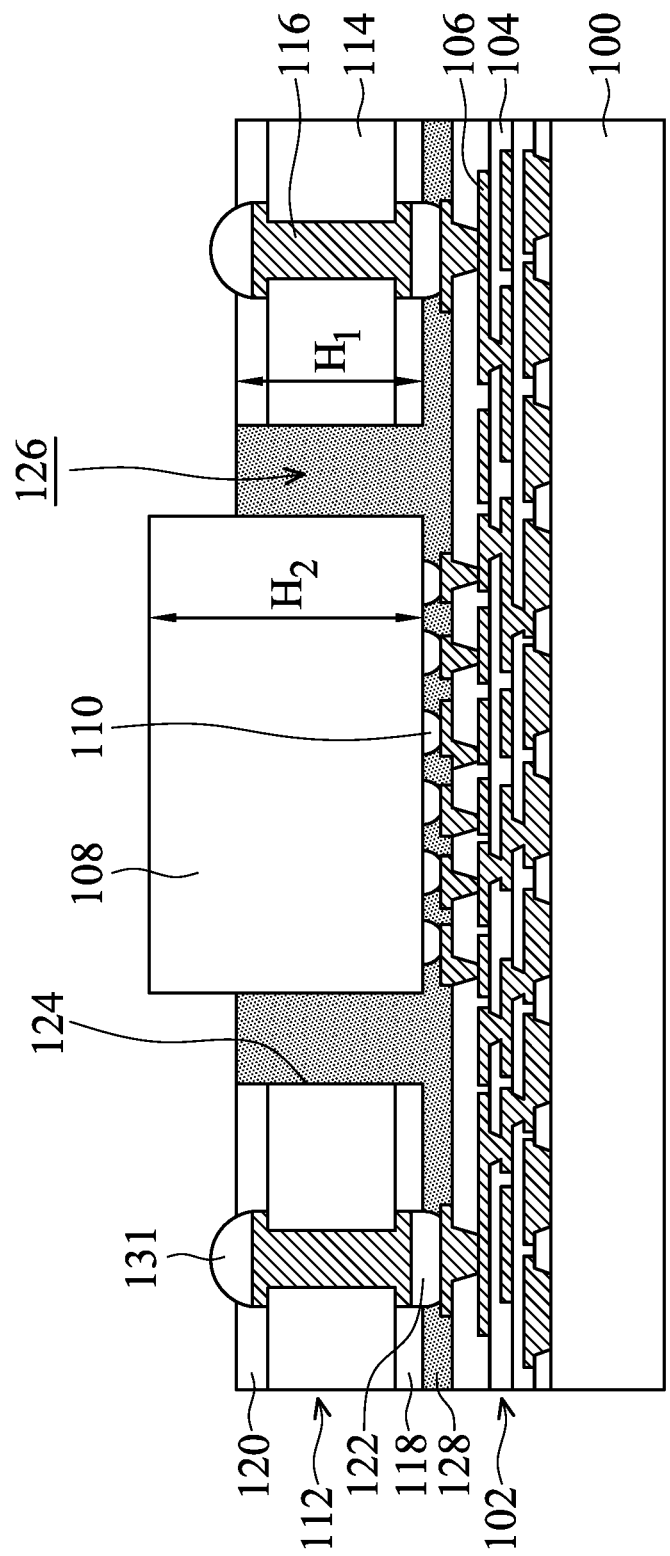

As shown in FIG. 2B, an underfill layer 128 is formed to protect the bonding structures 110 and 122, in accordance with some embodiments. The materials and formation methods of the underfill layer 128 shown in FIG. 2B may be the same as or similar to those of the underfill layer 128 shown in FIG. 1D. In some embodiments, the underfill layer 128 extends upwards to partially or completely fill the recess 126 surrounded by the interior sidewalls 124 of the interposer substrate 112, as shown in FIG. 2B. In these cases, the underfill layer 128 also serves as a protective layer that protect the semiconductor die 108. In some embodiments, the top surface of the semiconductor die 108 is higher than the top surface of the underfill layer 128, as shown in FIG. 2B.

Figure 2C:
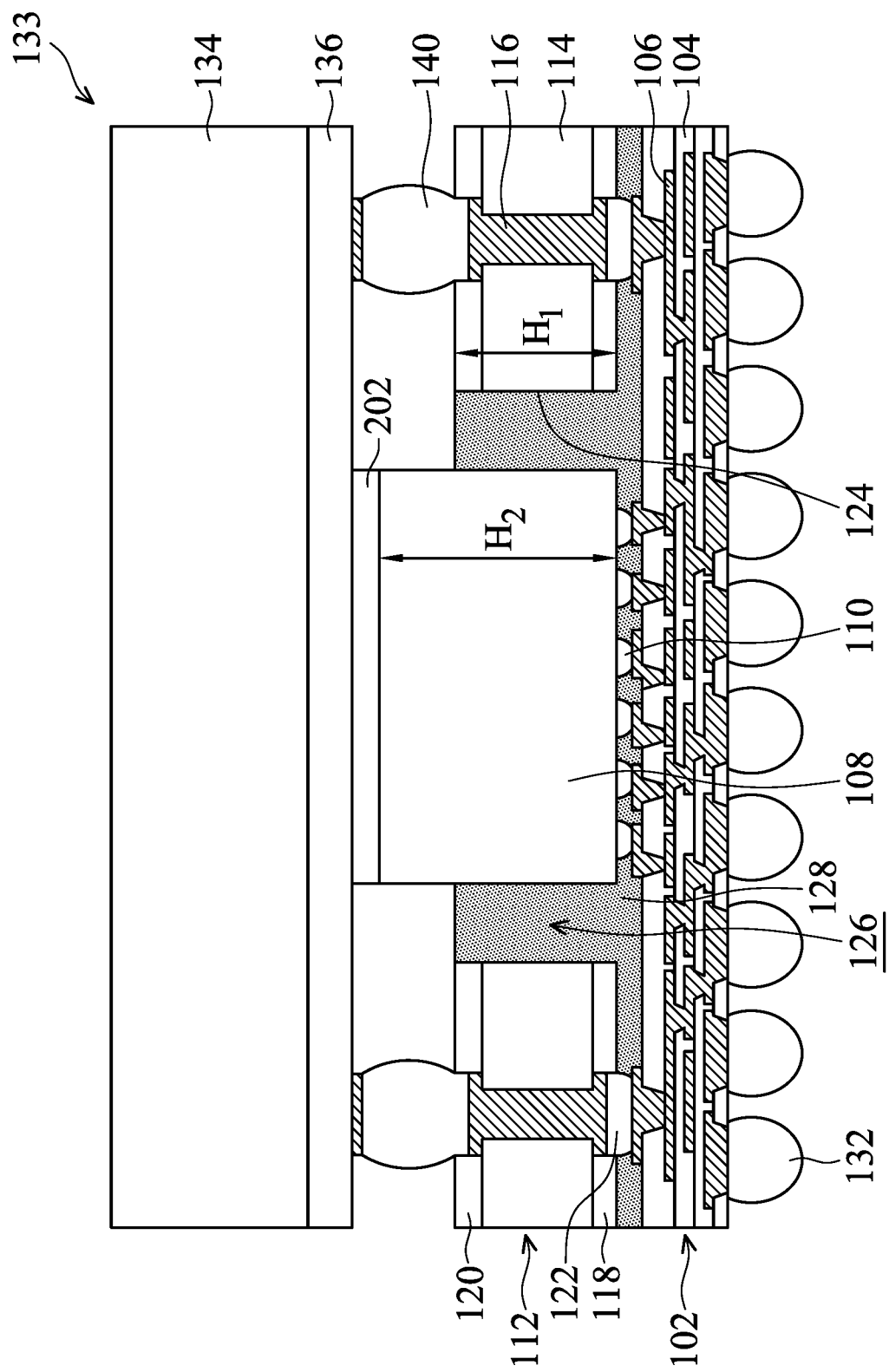

As shown in FIG. 2C, similar to the embodiments illustrated in FIG. 1J, the package structure 133 is stacked and bonded onto the interposer substrate 112, in accordance with some embodiments. The bonding structures 140 are used to achieve the physical bonding and electrical connections between the package structure 133 and the interposer substrate 112. The electrical connections between the device elements in the package structure 133 and the device elements in the semiconductor die 108 are established through the interposer substrate 112 and the interconnection structure 102.

As shown in FIG. 2C, an adhesive layer 202 is used to enhance adhesion between the semiconductor die 108 and the package structure 133, in accordance with some embodiments. The adhesive layer 202 may be a die attachment film (DAF). In some embodiments, the adhesive layer 202 is formed on the semiconductor die 108 before the package structure 133 and the interposer substrate 112 are bonded through the bonding structures 140. In some other embodiments, the adhesive layer 202 is formed on the package structure 133 before the bonding between the package structure 133 and the interposer substrate 112.

Many variations and/or modifications can be made to embodiments of the disclosure. In some other embodiments, the adhesive layer 202 is not formed.

Figure 2D:
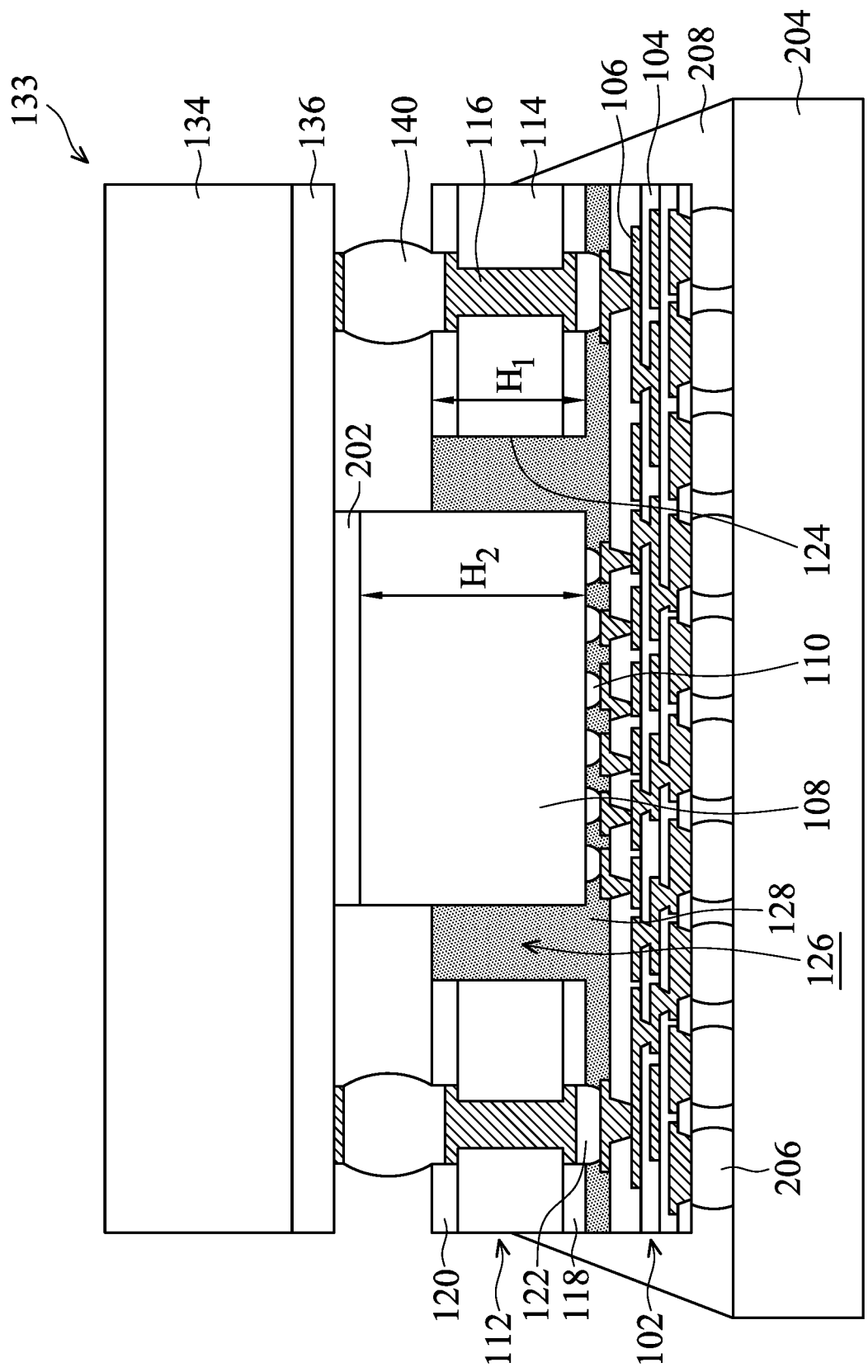

As shown in FIG. 2D, the structure shown in FIG. 2C is bonded to a substrate 204 through bonding structures 206, in accordance with some embodiments. The materials and formation methods of the bonding structures 206 may be the same as or similar to those of the bonding structures 122. In some embodiments, the substrate 204 is a printed circuit board. In some other embodiments, the substrate 204 is a semiconductor substrate with conductive features formed thereon.

In some embodiments, an underfill layer 208 is formed over the substrate 208 to surround and protect the bonding structures 206, as shown in FIG. 2D. The materials and formation methods of the underfill layer 208 may be the same as or similar to those of the underfill layer 128. In some embodiments, the underfill layer 208 extends upwards to cover sidewalls of the interconnection structure 102. In some embodiments, the underfill layer 208 extends upwards to cover sidewalls of the underfill layer 128. In some embodiments, the underfill layer 208 extends upwards to partially cover sidewalls of the interposer substrate 112.

Figure 3A:
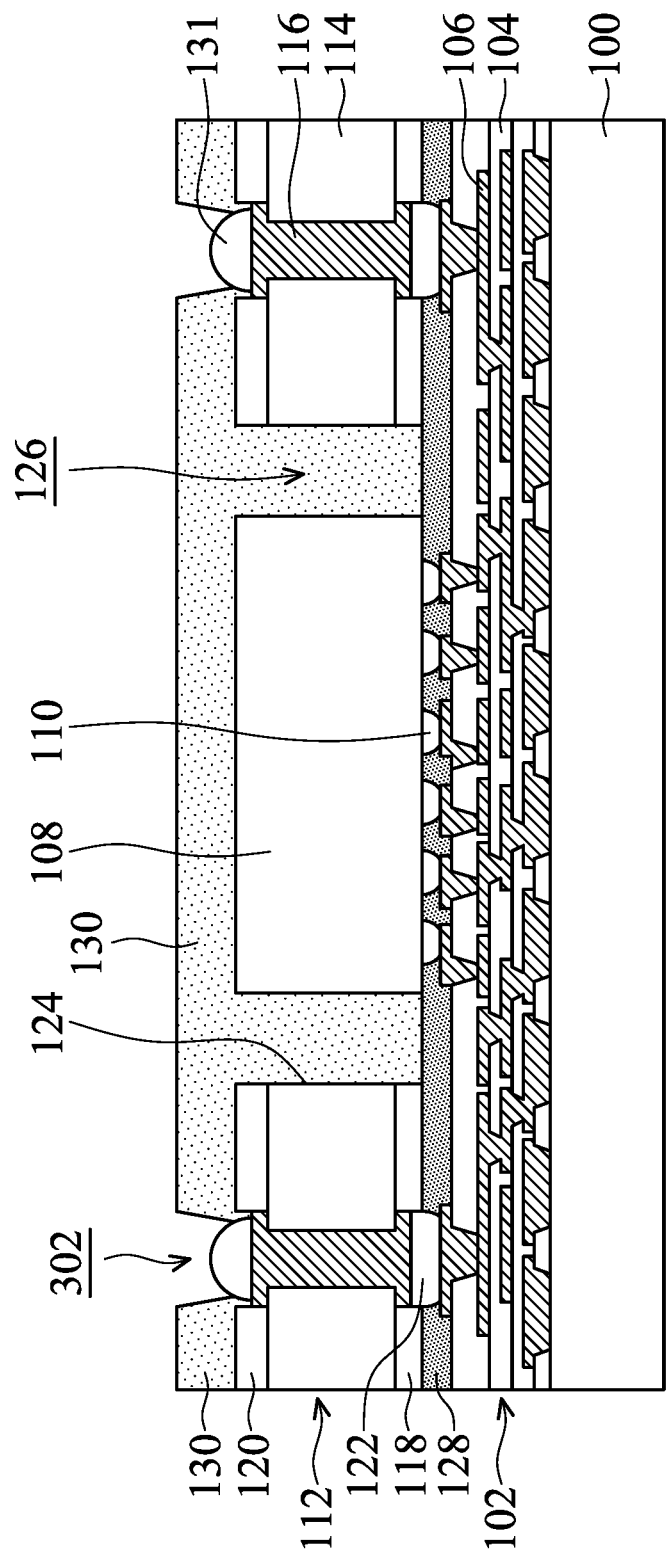
FIGS. 3A-3E are cross-sectional views of various stages of a process for forming a chip package, in accordance with some embodiments.

FIGS. 3A-3E are cross-sectional views of various stages of a process for forming a chip package, in accordance with some embodiments. As shown in FIG. 3A, a structure similar to that shown in FIG. 1E is received or provided. In some embodiments, the semiconductor die 108 is as high as the interposer substrate 112. However, embodiments of the disclosure are not limited thereto. In some other embodiments, similar to the embodiments illustrated in FIG. 2A, the semiconductor die 108 is higher than the interposer substrate 112. In these cases, the distance between the top surface of the semiconductor die 108 and the interconnection structure 102 is greater than the distance between the top surface of the interposer substrate 112 and the interconnection structure 102.

Afterwards, openings 302 are formed in the protective layer 130 to partially expose the conductive features 116, as shown in FIG. 3A in accordance with some embodiments. The openings 302 may be formed using an energy beam drilling process, a mechanical drilling process, a photolithography process, an etching process, one or more other applicable processes, or a combination thereof.

As shown in FIG. 3A, conductive elements 131 are then formed on the exposed conductive features 116 of the interposer substrate 112, in accordance with some embodiments. The materials and formation methods of the conductive elements 131 shown in FIG. 3A may be the same as or similar to those of the conductive elements 131 shown in FIG. 1F. In some embodiments, each of the conductive elements 131 is positioned in the corresponding opening 302. In some other embodiments, portions of the conductive elements 302 protrude from the openings 302 (not shown). In these cases, the top surfaces of the conductive elements are higher than the top surface of the protective layer 130.

Figure 3B:
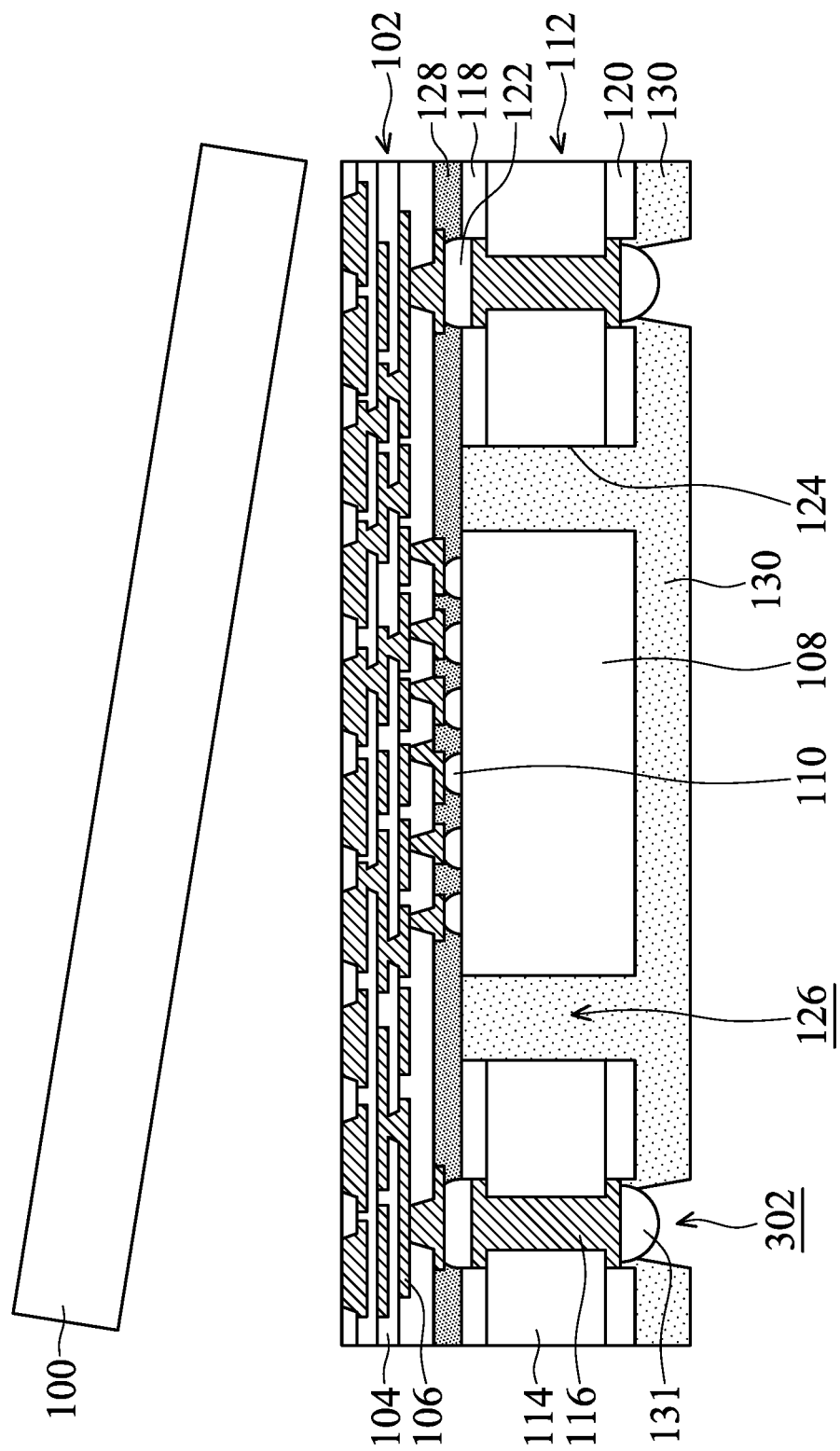
Figure 3C:
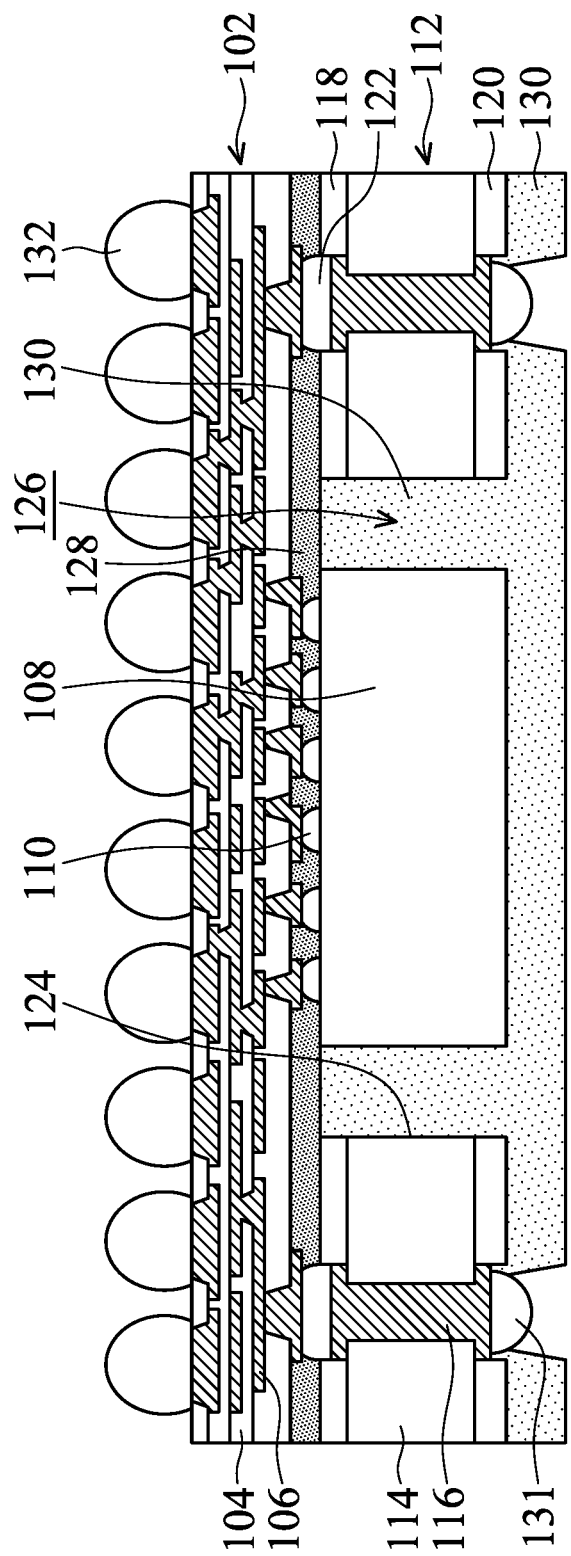

As shown in FIG. 3B, the structure shown in FIG. 3A is flipped upside down, and the carrier substrate 100 is then removed to expose some of the conductive features 106, in accordance with some embodiments. In some embodiments, the structure shown in FIG. 3A is flipped upside down onto a second carrier substrate (not shown) before the removal of the carrier substrate 100. The second carrier substrate may be a carrier tape frame. Afterwards, conductive elements 132 are formed on the exposed conductive features 106, as shown in FIG. 3C in accordance with some embodiments. The materials and formation methods of the conductive elements 132 shown in FIG. 3C may be the same as or similar to those of the conductive elements 132 shown in FIG. 1H.

Figure 3D:
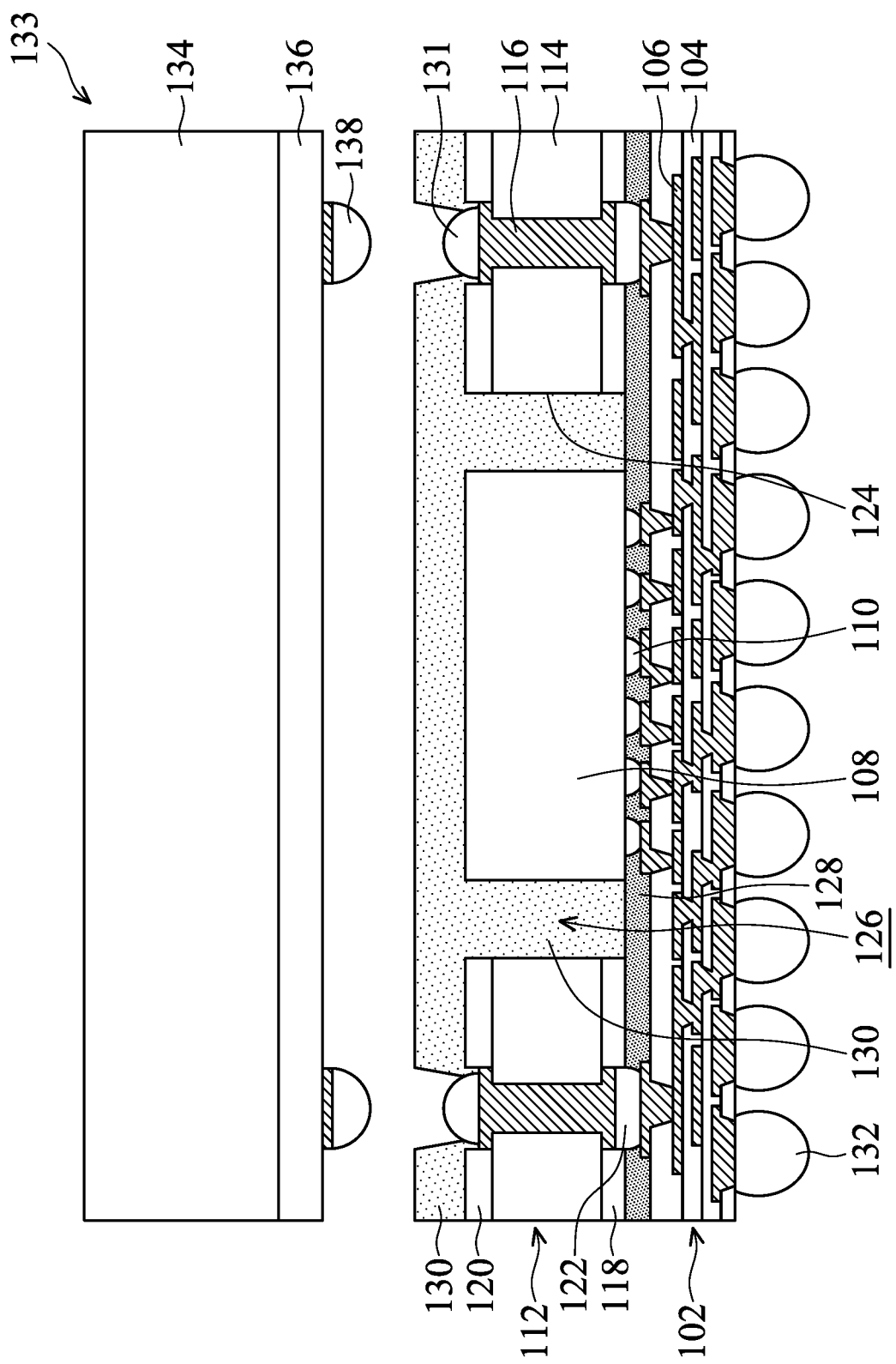

As shown in FIG. 3D, similar to the embodiments illustrated in FIG. 1I, the structure shown in FIG. 3C is flipped upside down to be bonded to the package structure 133, in accordance with some embodiments.

Figure 3E:
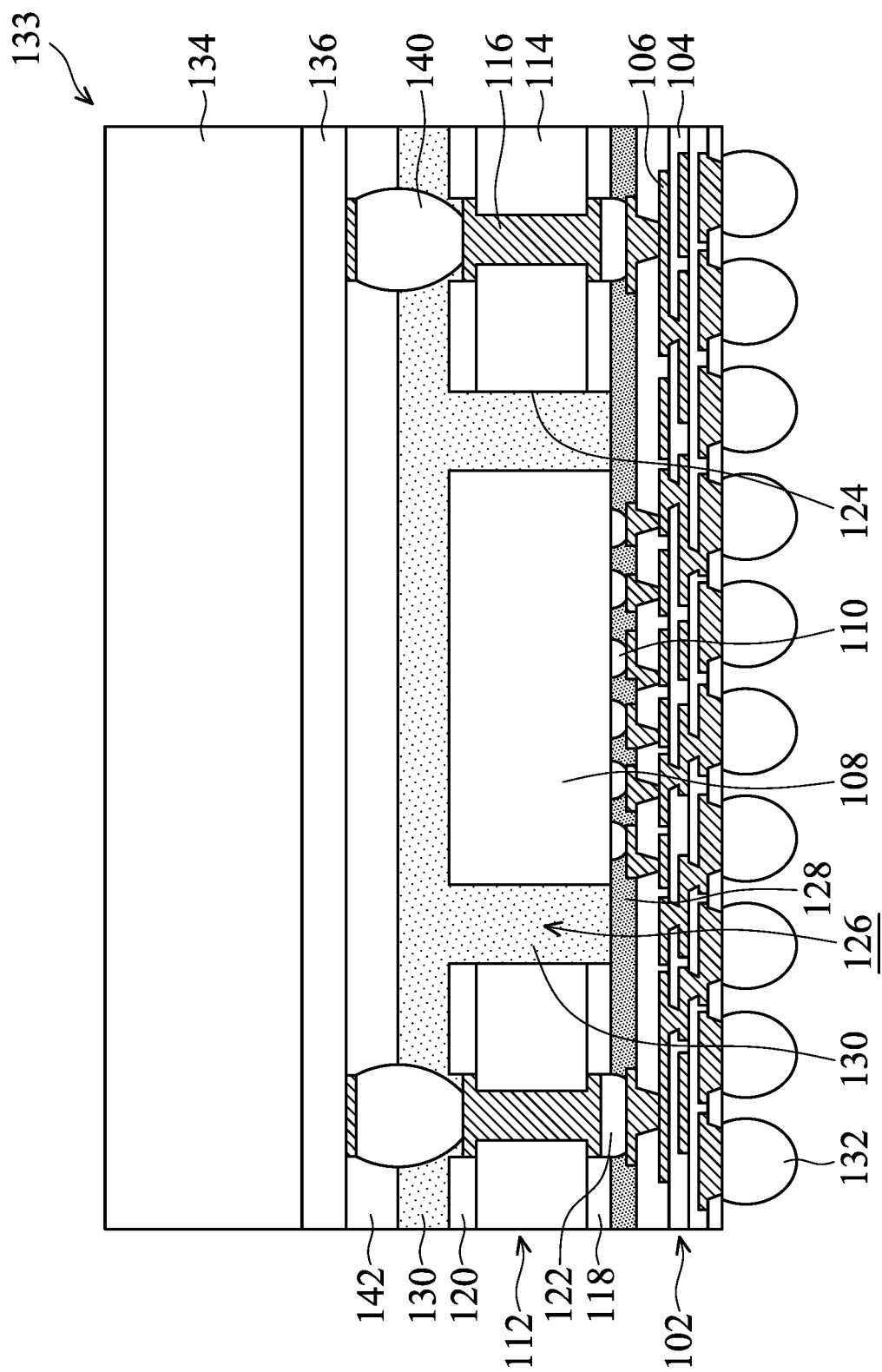

As shown in FIG. 3E, similar to the embodiments illustrated in FIG. 1J, the package structure 133 and the interposer substrate 112 are bonded together through the bonding structures 140, in accordance with some embodiments. Afterwards, similar to the embodiments illustrated in FIG. 1K, the underfill layer 142 is formed, as shown in FIG. 3E in accordance with some embodiments.

Many variations and/or modifications can be made to embodiments of the disclosure. In some other embodiments, the protective layer 130 is not formed. In some embodiments, the underfill layer 142 is formed to protect the bonding structures 140. The underfill layer 142 may fill the recess 126 surrounded by the interior sidewalls 124 of the interposer substrate 112. Therefore, the underfill layer 142 may also surround the semiconductor die 108 and serve as a protective layer.

Figure 4A:
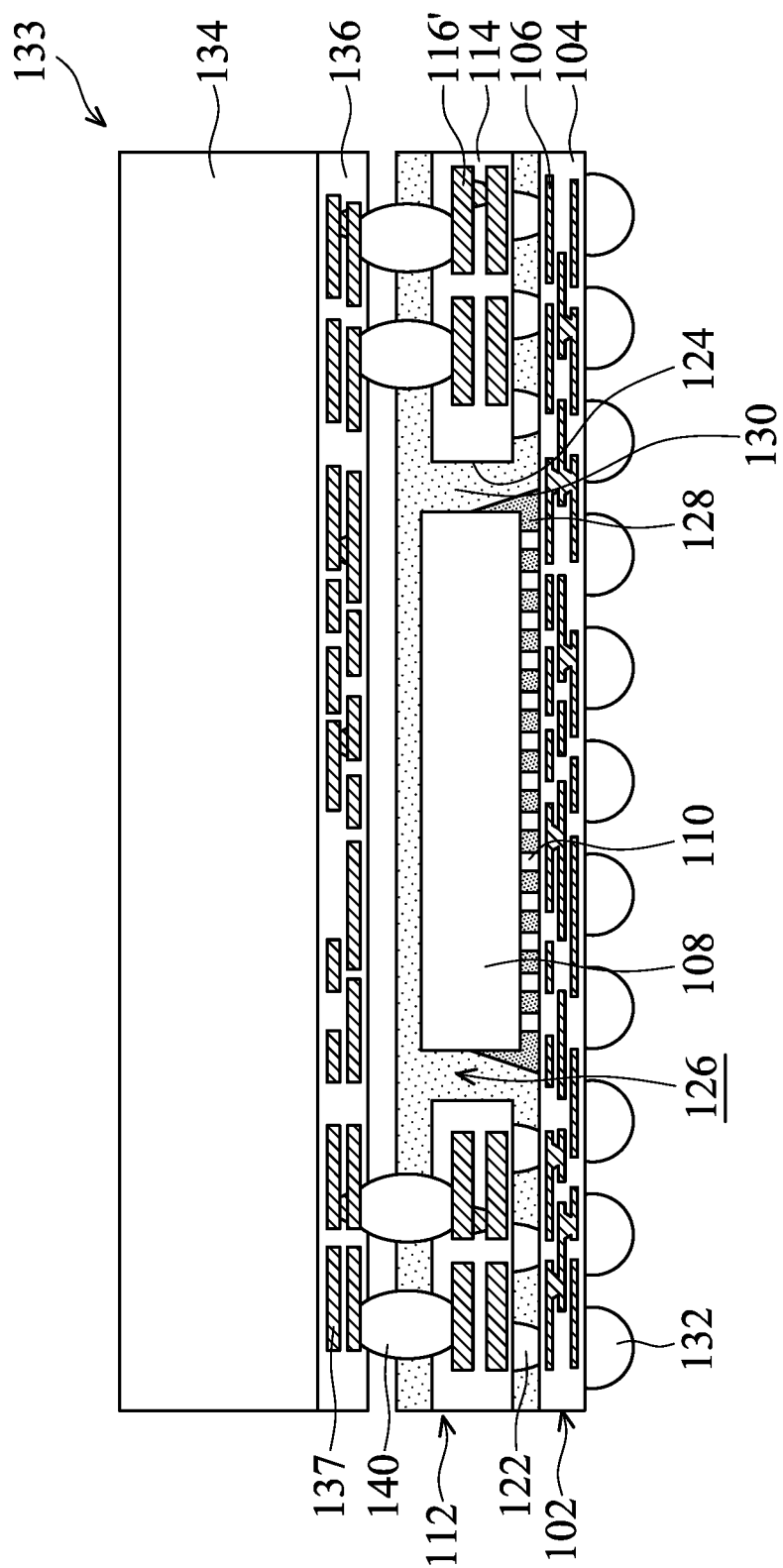
FIGS. 4A-4B are cross-sectional views of various stages of a process for forming a chip package, in accordance with some embodiments.
Figure 4B:
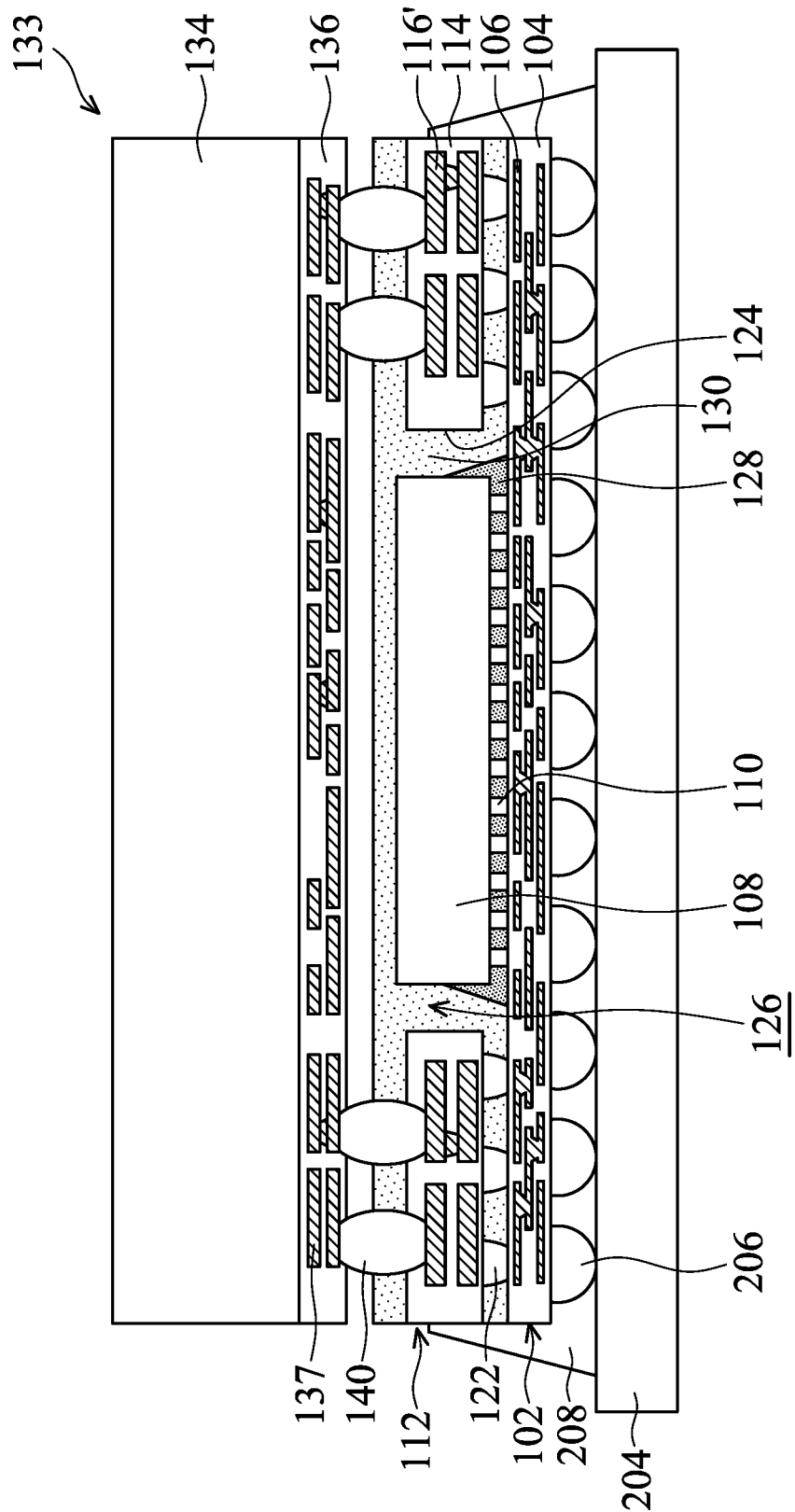

FIGS. 4A-4B are cross-sectional views of various stages of a process for forming a chip package, in accordance with some embodiments. As shown in FIG. 4A, a structure similar to the embodiments illustrated in FIG. 3E is formed. In some embodiments, the interposer substrate 112 includes multiple conductive features 116' formed in the base portion 114. In some embodiments, each of the conductive features 116' does not penetrate through opposite surfaces of the base portion 114.

In some embodiments, the underfill layer 128 is in direct contact with the bonding structures 110. In some embodiments, the underfill layer 128 is not in direct contact with the bonding structures 122. In some embodiments, the protective layer 130 is in direct contact with the bonding structures 122. In some embodiments, the protective layer 130 is not in direct contact with the bonding structures 110.

In some embodiments, the semiconductor die 108 is higher than the interposer substrate 112. The top surface of the semiconductor die 108 is positioned at a higher height level than the interposer substrate 112. As shown in FIG. 4A, the interconnection structure 136 of the package structure 133 includes multiple conductive features 137. Some of the conductive features 137 are electrically connected to the bonding structures 140.

As shown in FIG. 4B, similar to the embodiments illustrated in FIG. 2D, the structure shown in FIG. 4A is bonded to the substrate 204 through the bonding structures 206, in accordance with some embodiments. In some embodiments, the underfill layer 208 is formed to protect the bonding structures 206.

Figure 5A:
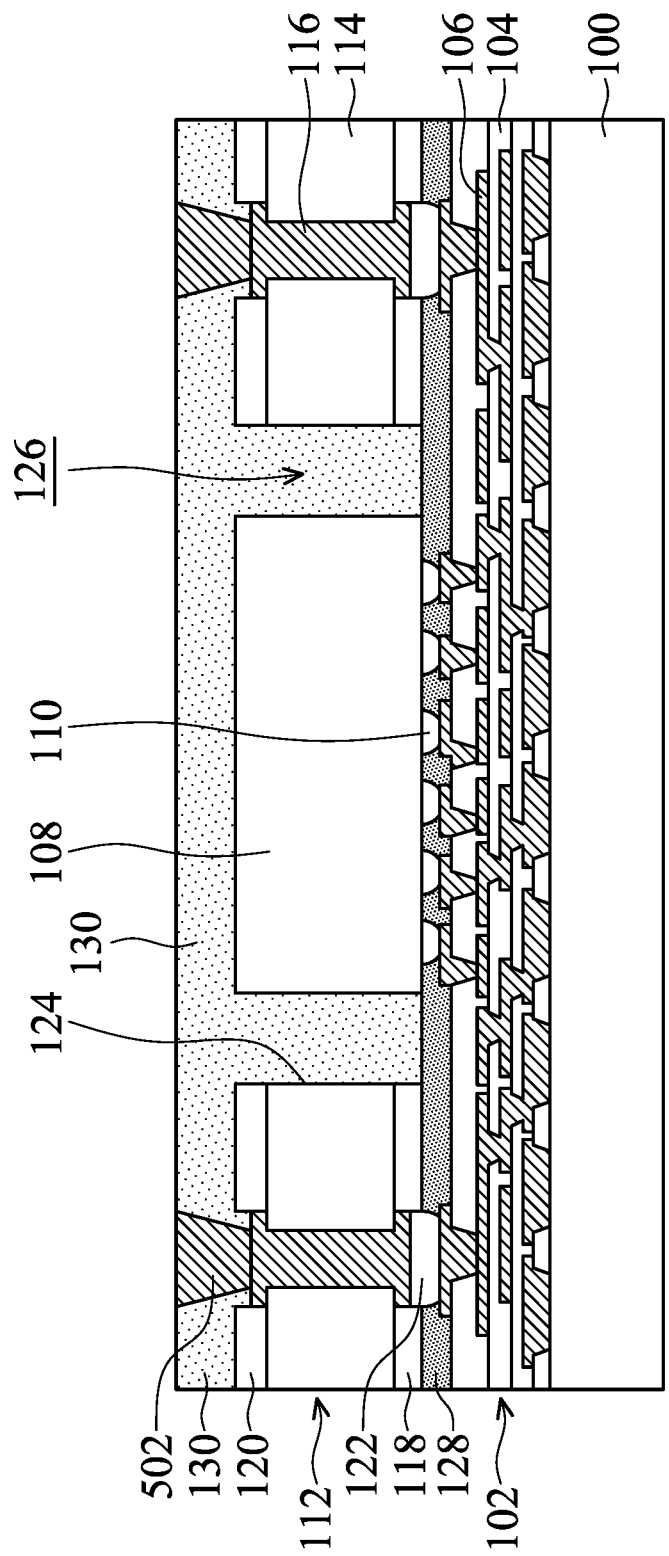
FIGS. 5A-5F are cross-sectional views of various stages of a process for forming a chip package, in accordance with some embodiments.

FIGS. 5A-5F are cross-sectional views of various stages of a process for forming a chip package, in accordance with some embodiments. As shown in FIG. 5A, a structure similar to that shown in FIG. 1E is received or provided. In some embodiments, the semiconductor die 108 is as high as the interposer substrate 112. However, embodiments of the disclosure are not limited thereto. In some other embodiments, similar to the embodiments illustrated in FIG. 2A, the semiconductor die 108 is higher than the interposer substrate 112.

Afterwards, openings are formed in the protective layer 130 to partially expose the conductive features 116, as shown in FIG. 5A in accordance with some embodiments. Similar to the openings 302, the openings may be formed using an energy beam drilling process, a mechanical drilling process, a photolithography process, an etching process, one or more other applicable processes, or a combination thereof.

Afterwards, as shown in FIG. 5A, conductive elements 502 are then formed on the exposed conductive features 116 to fill the openings formed in the protective layer 130, in accordance with some embodiments. In some embodiments, the conductive elements 502 are conductive pillars. In some embodiments, the top surfaces of the conductive elements 502 and the protective layer 130 are substantially coplanar. In some embodiments, a planarization process is used to ensure the top surfaces of the conductive elements 502 and the protective layer 130 are substantially coplanar. The planarization process may include a mechanical grinding process, a CMP process, one or more other applicable processes, or a combination thereof.

The conductive elements 502 may be made of or include copper, gold, cobalt, aluminum, platinum, graphene, one or more other suitable conductive materials, or a combination thereof. The conductive elements 502 may be formed using an electroplating process, an electroless plating process, a chemical vapor deposition (CVD) process, a physical vapor deposition (PVD) process, a printing process, one or more other applicable processes, or a combination thereof.

Figure 5B:
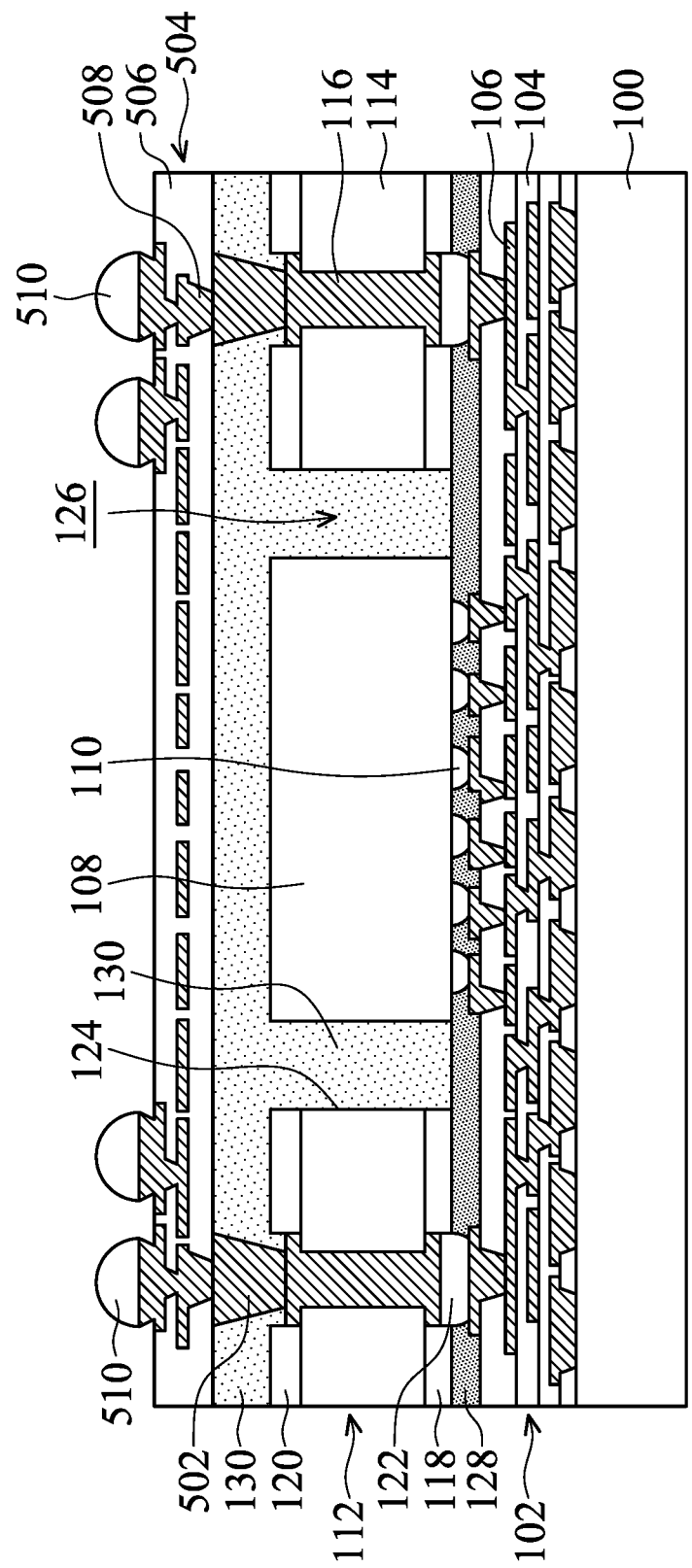

As shown in FIG. 5B, an interconnection structure 504 is formed on the protective layer 130 and the conductive elements 502, in accordance with some embodiments. The interconnection structure 504 may include an insulating layer 506 and multiple conductive features 508. The insulating layer 506 may include multiple sub-layers. The materials and formation methods of the interconnection structure 504 may be the same as or similar to those of the interconnection structure 102.

Afterwards, conductive elements 510 are formed on some of the conductive features 508 of the interconnection structure 504, as shown in FIG. 5B in accordance with some embodiments. The materials and formation methods of the conductive elements 510 may be the same as or similar to those of the conductive elements 131 illustrated in FIG. 1F. In some embodiments, most portions of the bottom surface of the interconnection structure 504 are in direct contact with the same material layer (i.e., the protective layer 130). In some embodiments, both of the protective layer 130 and the insulating layer 506 are made of the same or similar polymer materials. Therefore, the protective layer 130 and the insulating layer 506 have similar thermal expansion coefficients. Therefore, the interconnection structure 504 may suffer less thermal stress during subsequent thermal processes. The quality and reliability of the interconnection structure 504 may be ensured.

Figure 5C:
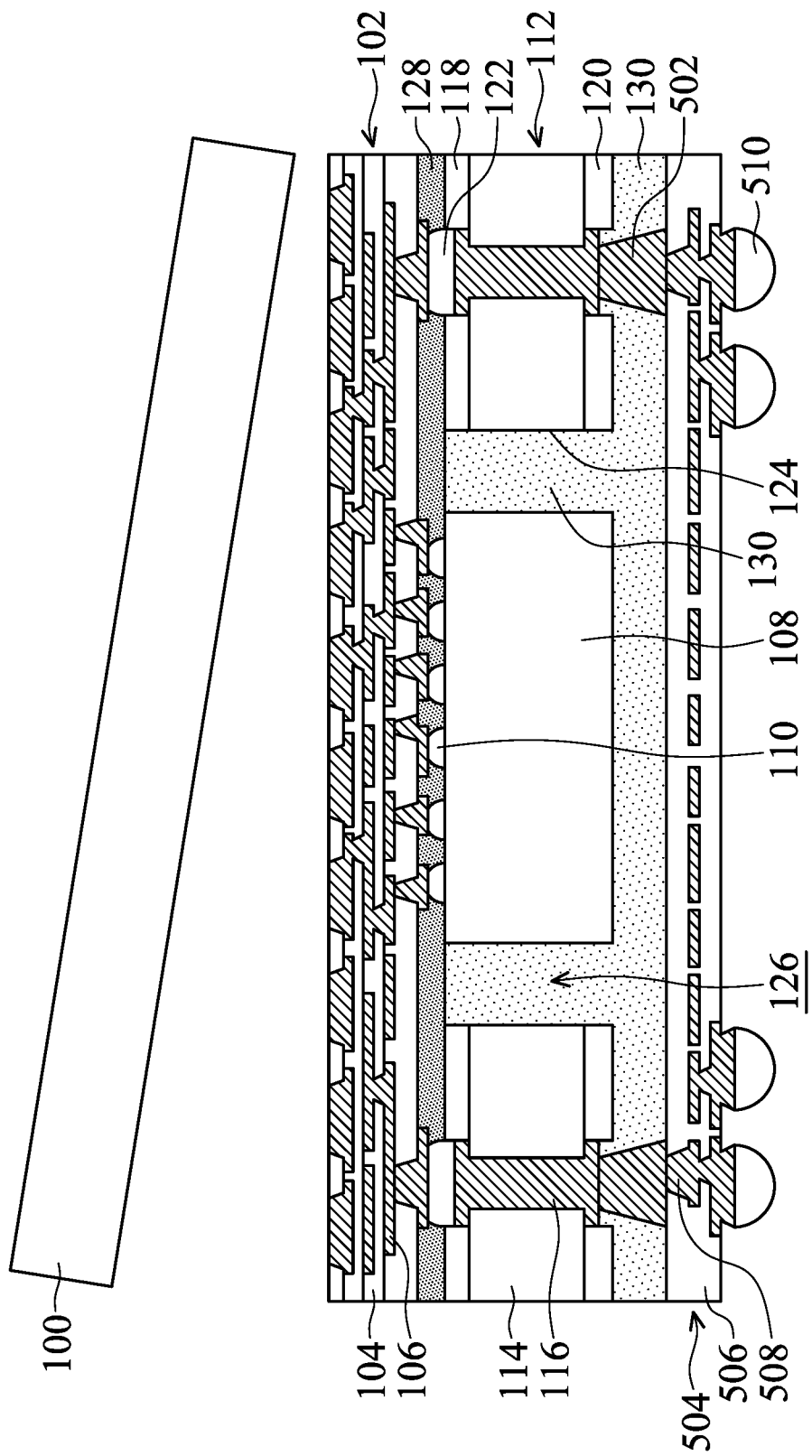

As shown in FIG. 5C, the structure shown in FIG. 5B is flipped upside down, and the carrier substrate 100 is then removed to expose some of the conductive features 106, in accordance with some embodiments. In some embodiments, the structure shown in FIG. 5B is flipped upside down onto a second carrier substrate (not shown) before the removal of the carrier substrate 100. The second carrier substrate may be a carrier tape frame.

Figure 5D:
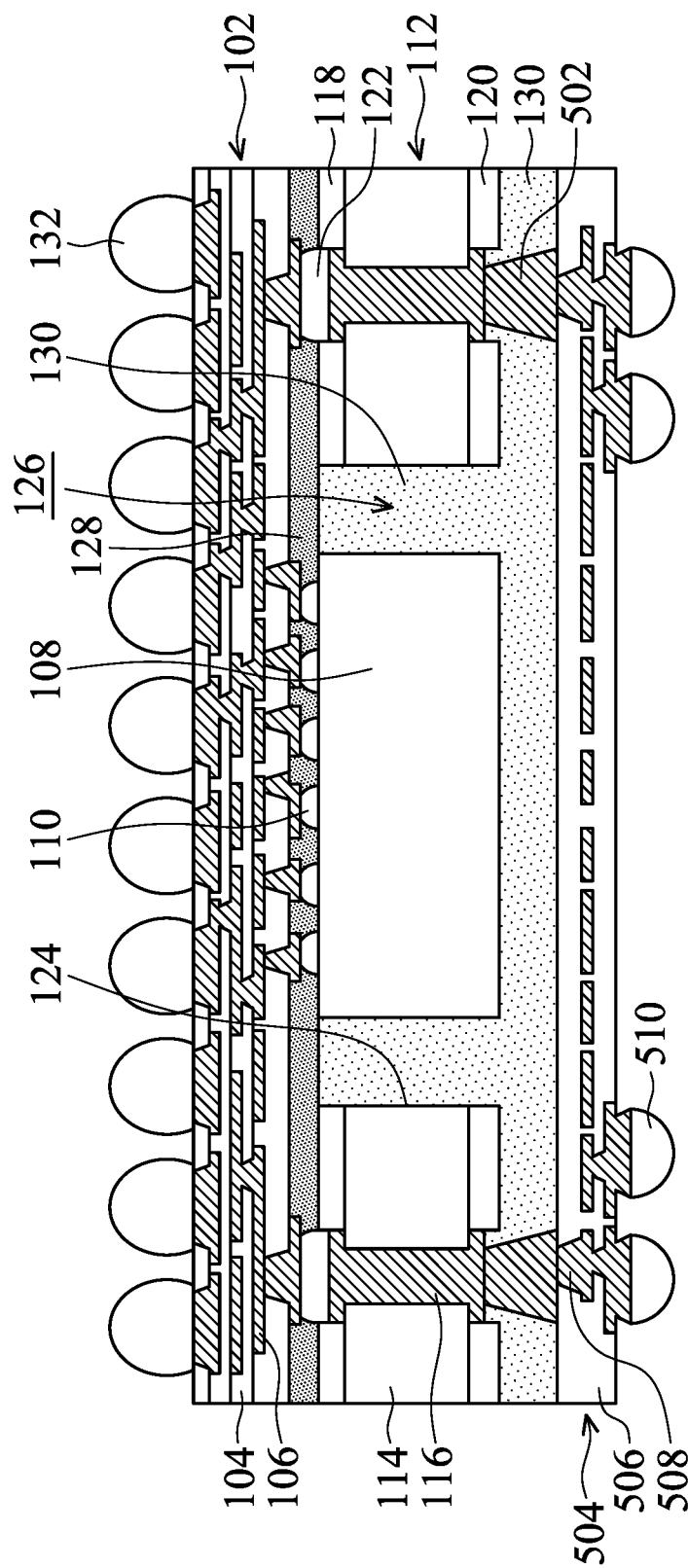

Afterwards, conductive elements 132 are formed on the exposed conductive features 106, as shown in FIG. 5D in accordance with some embodiments. The materials and formation methods of the conductive elements 132 shown in FIG. 5D may be the same as or similar to those of the conductive elements 132 shown in FIG. 1H.

Figure 5E:
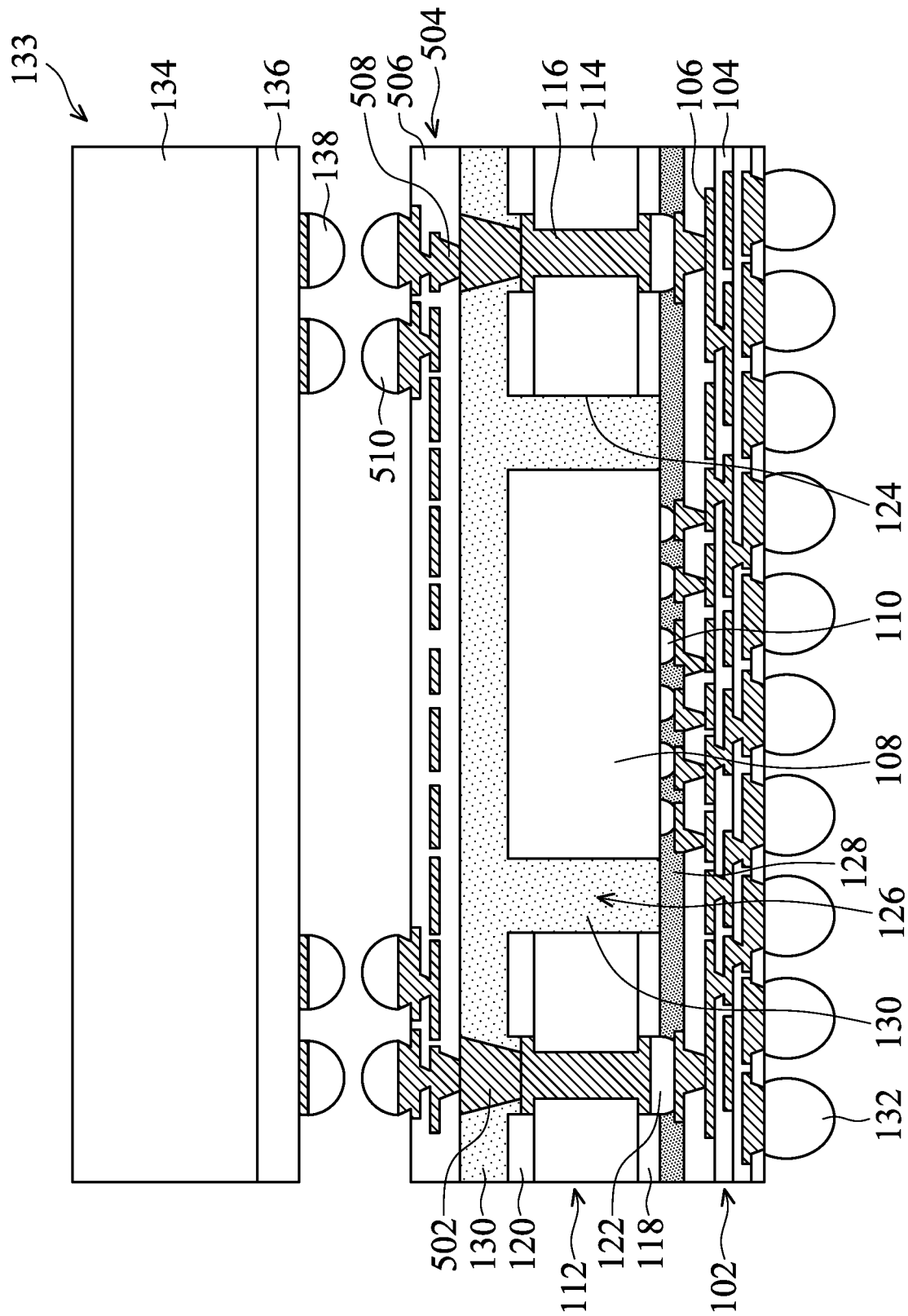

As shown in FIG. 5E, similar to the embodiments illustrated in FIG. 1I, the structure shown in FIG. 5D is flipped upside down to be bonded to the package structure 133, in accordance with some embodiments.

Figure 5F:
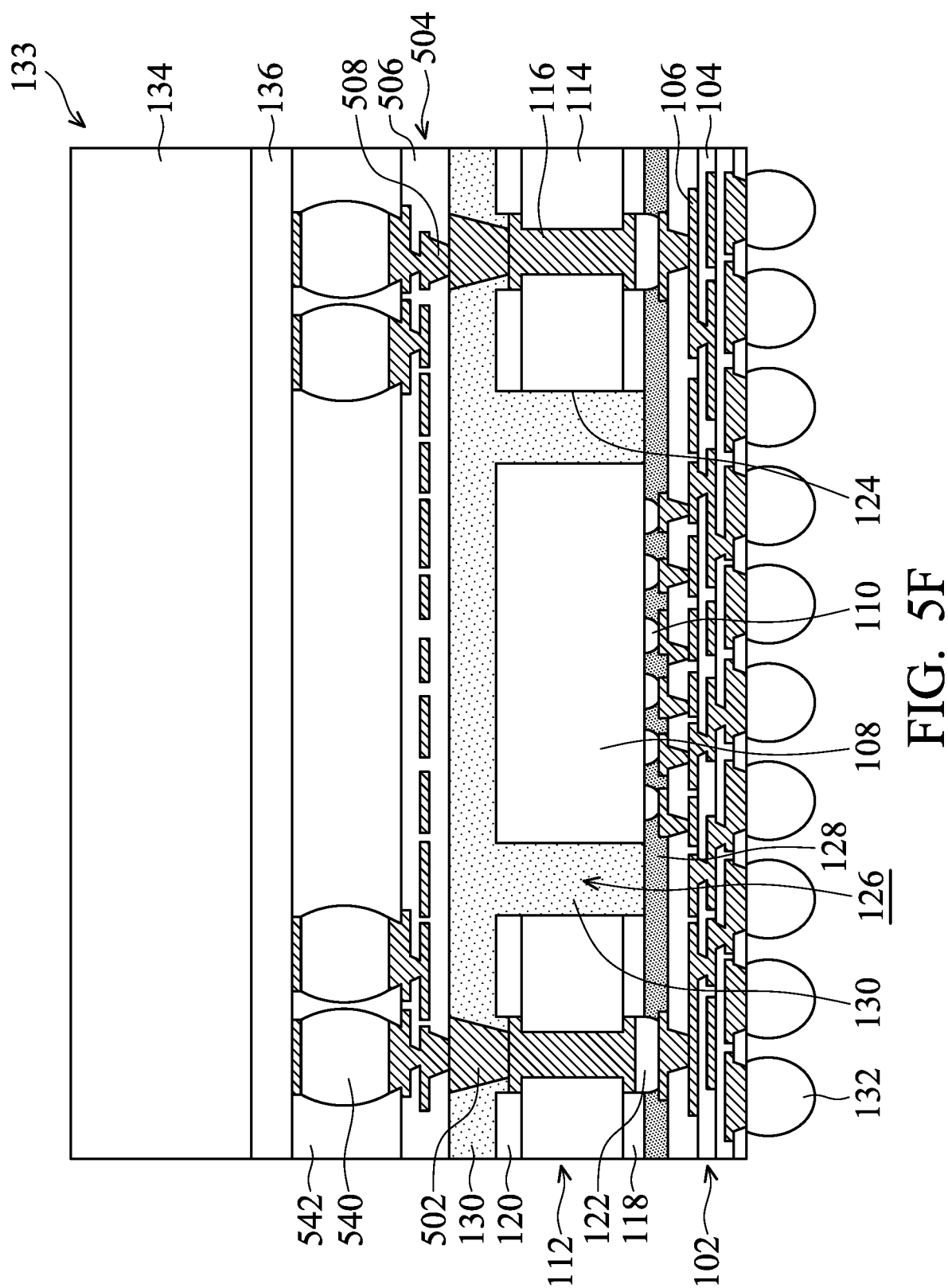

As shown in FIG. 5F, similar to the embodiments illustrated in FIG. 1J, the package structure 133 and the interposer substrate 112 are bonded together through bonding structures 540, in accordance with some embodiments. In some embodiments, a reflow process is used to melt the aligned conductive elements 138 and 510 together. As a result, the bonding structures 540 are formed. The materials and formation methods of the bonding structures 540 may be the same as or similar to those of the bonding structures 140 illustrated in FIG. 1J.

Afterwards, similar to the embodiments illustrated in FIG. 1K, an underfill layer 542 is formed to protect the bonding structures 540, as shown in FIG. 5F in accordance with some embodiments. The materials and formation methods of the underfill layer 542 may be the same as or similar to those of the underfill layer 142 illustrated in FIG. 1K.

Figure 6A:
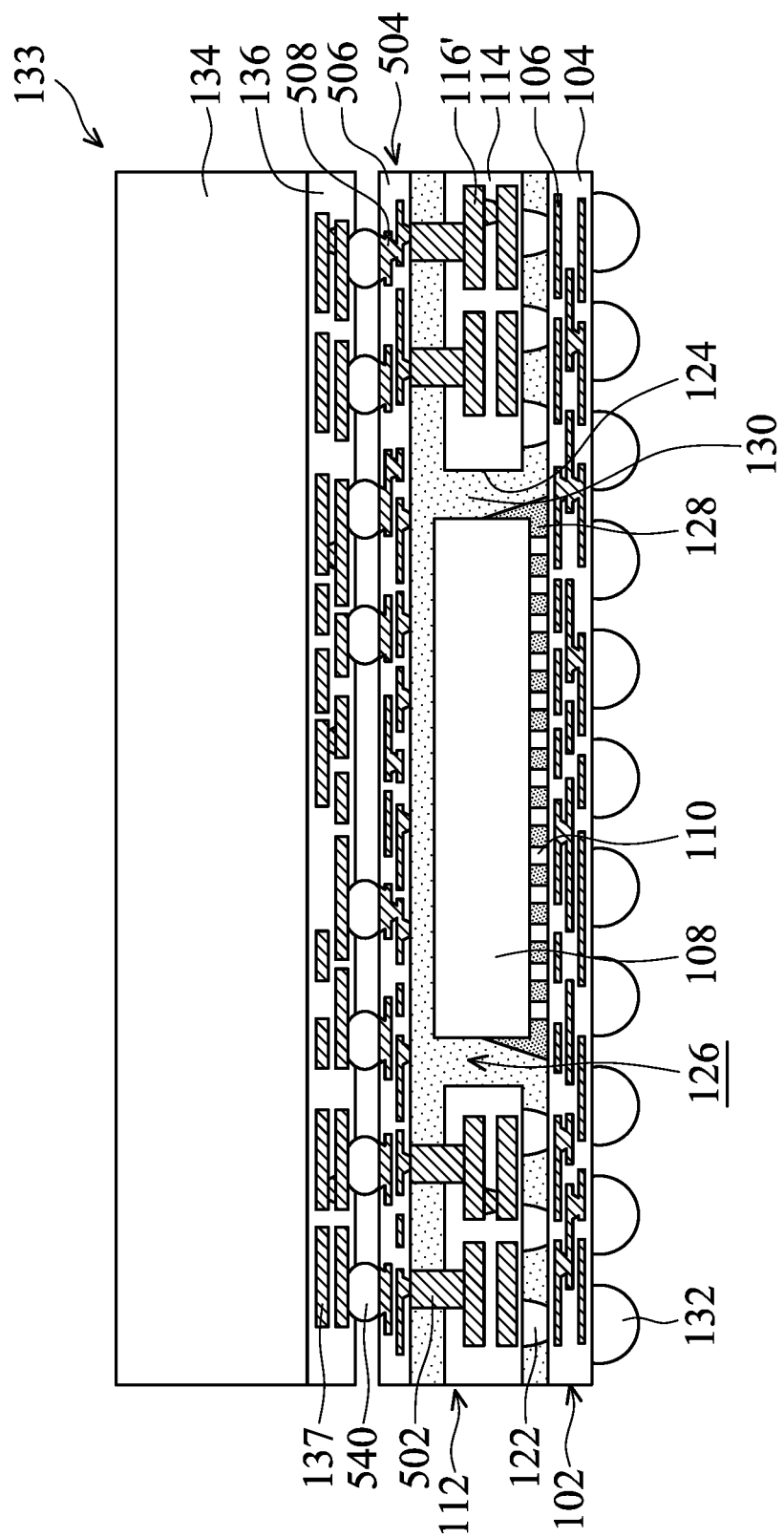
FIGS. 6A-6B are cross-sectional views of various stages of a process for forming a chip package, in accordance with some embodiments.
Figure 6B:
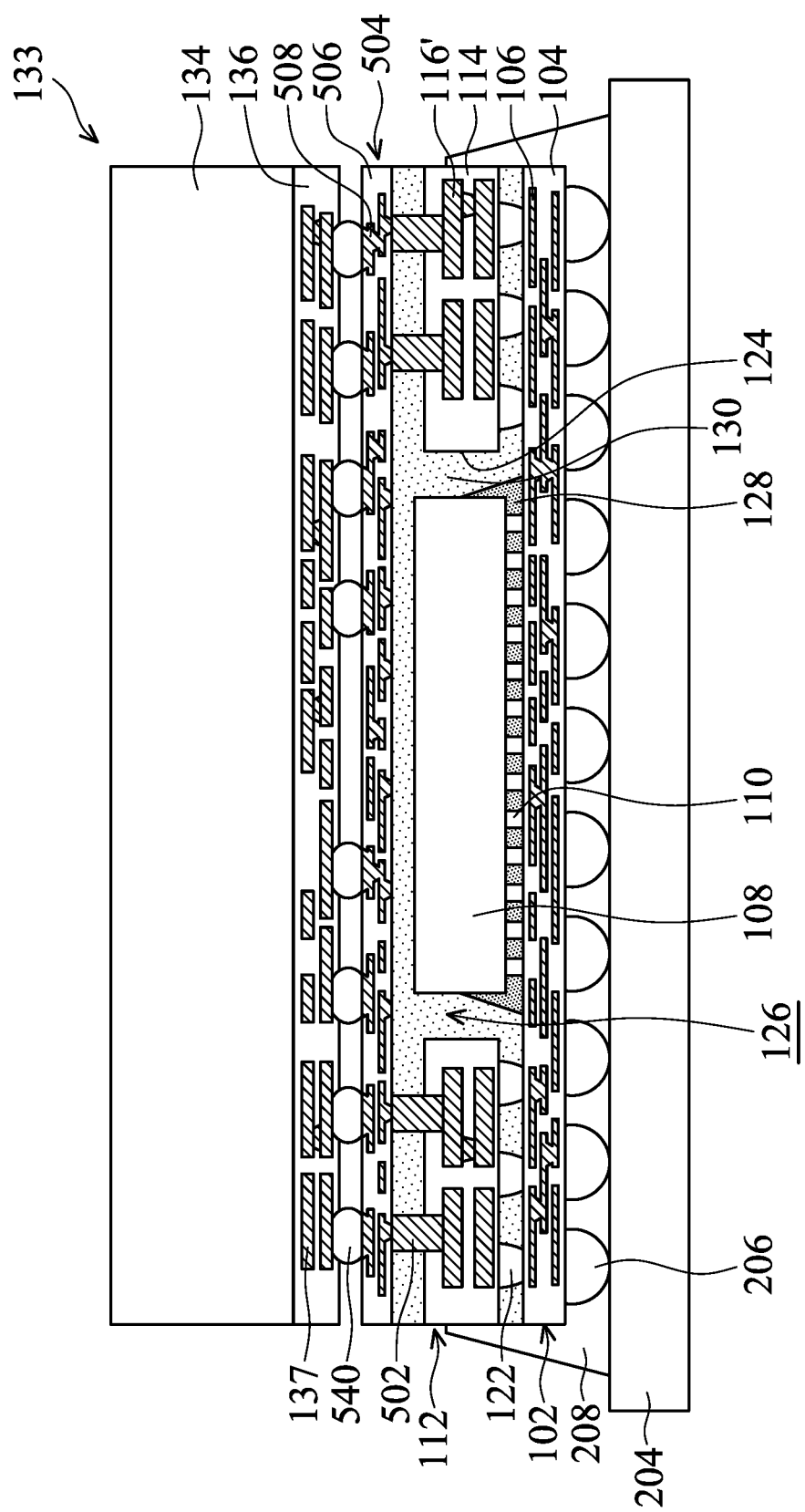

FIGS. 6A-6B are cross-sectional views of various stages of a process for forming a chip package, in accordance with some embodiments. As shown in FIG. 6A, a structure similar to the embodiments illustrated in FIG. 5F is formed. In some embodiments, the interposer substrate 112 includes multiple conductive features 116' formed in the base portion 114. In some embodiments, the interposer substrate 112 also includes conductive elements 502. The conductive elements 502 may be conductive vias. In some embodiments, each of the conductive features 116' does not penetrate through opposite surfaces of the base portion 114.

In some embodiments, the underfill layer 128 is in direct contact with the bonding structures 110. In some embodiments, the underfill layer 128 is not in direct contact with the bonding structures 122. In some embodiments, the protective layer 130 is in direct contact with the bonding structures 122. In some embodiments, the protective layer 130 is not in direct contact with the bonding structures 110.

In some embodiments, the semiconductor die 108 is higher than the interposer substrate 112. The top surface of the semiconductor die 108 is positioned at a higher height level than the interposer substrate 112. As shown in FIG. 6A, the interconnection structure 136 of the package structure 133 includes multiple conductive features 137. Some of the conductive features 137 are electrically connected to the bonding structures 540.

In some embodiments, the protective layer 130 covers the top surfaces of the interposer substrate 112 and the semiconductor die 108, and the interconnection structure 504 is formed over the protective layer 130. The interconnection structure 504 is prevented from being in direct contact with the interface between the semiconductor die 108 and the protective layer 130 which may have higher stress. Therefore, the interconnection structure 504 may have better reliability. The routing of the conductive features 506 is prevented from being limited.

In some other embodiments, the interconnection structure is in direct contact with the interface between the semiconductor die and the protective layer. In some cases, the portion of the interconnection structure extending across the interface may suffer from high stress. The conductive features may need to be formed away from these high stress portions (i.e., the kick-out zone) to ensure reliable electrical connection. The routing of the conductive features is therefore limited.

As shown in FIG. 6B, similar to the embodiments illustrated in FIG. 2D, the structure shown in FIG. 6A is bonded to the substrate 204 through the bonding structures 206, in accordance with some embodiments. In some embodiments, the underfill layer 208 is formed to protect the bonding structures 206.

Figure 7A:
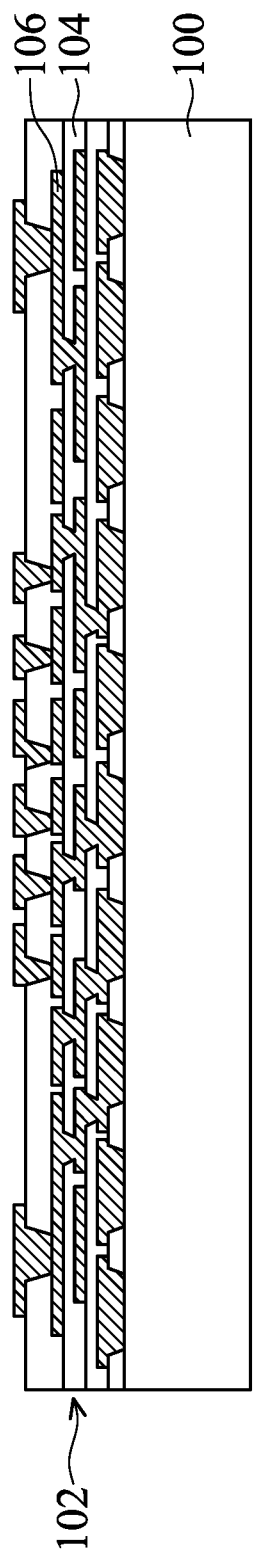
FIGS. 7A-7I are cross-sectional views of various stages of a process for forming a chip package, in accordance with some embodiments.

FIGS. 7A-7I are cross-sectional views of various stages of a process for forming a chip package, in accordance with some embodiments. As shown in FIG. 7A, a structure similar to the structure shown in FIG. 1A is received or formed.

Figure 7B:
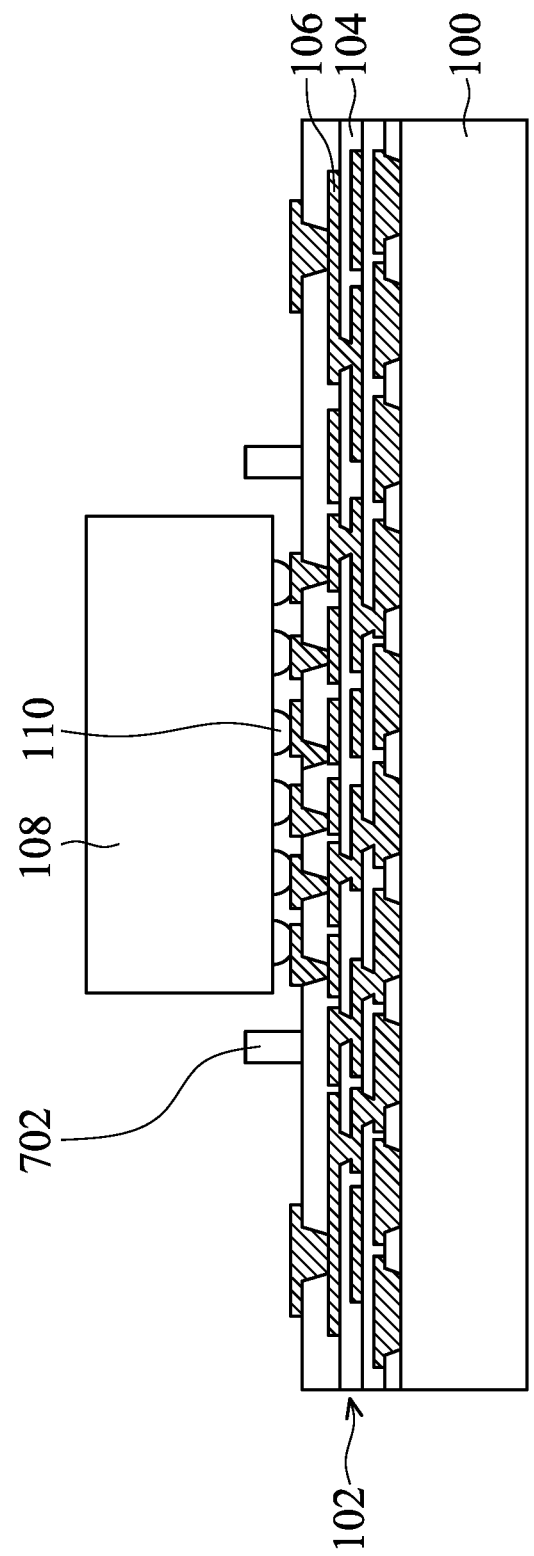

As shown in FIG. 7B, a blocking element 702 is formed over the interconnection structure 102, in accordance with some embodiments. In some embodiments, the blocking element 702 is a ring structure that continuously surrounds the bonding structures 110 and the semiconductor die 108. The blocking element 702 may be made of an insulating material, a conductive material, a semiconductor material, or a combination thereof. In some embodiments, the blocking element 702 is made of or includes a photosensitive polymer material. In some embodiments, a photosensitive polymer material layer is formed over the interconnection structures 102. Afterwards, a photolithography process is used to pattern the photosensitive polymer material layer. As a result, the blocking element 702 with desired pattern is formed.

Afterwards, similar to the embodiments illustrated in FIG. 1B, the semiconductor die 108 is picked and placed on the interconnection structure 102, as shown in FIG. 7B in accordance with some embodiments. In some embodiments, the semiconductor die 108 is bonded to the interconnection structure 102 through the bonding structures 110.

Figure 7C:
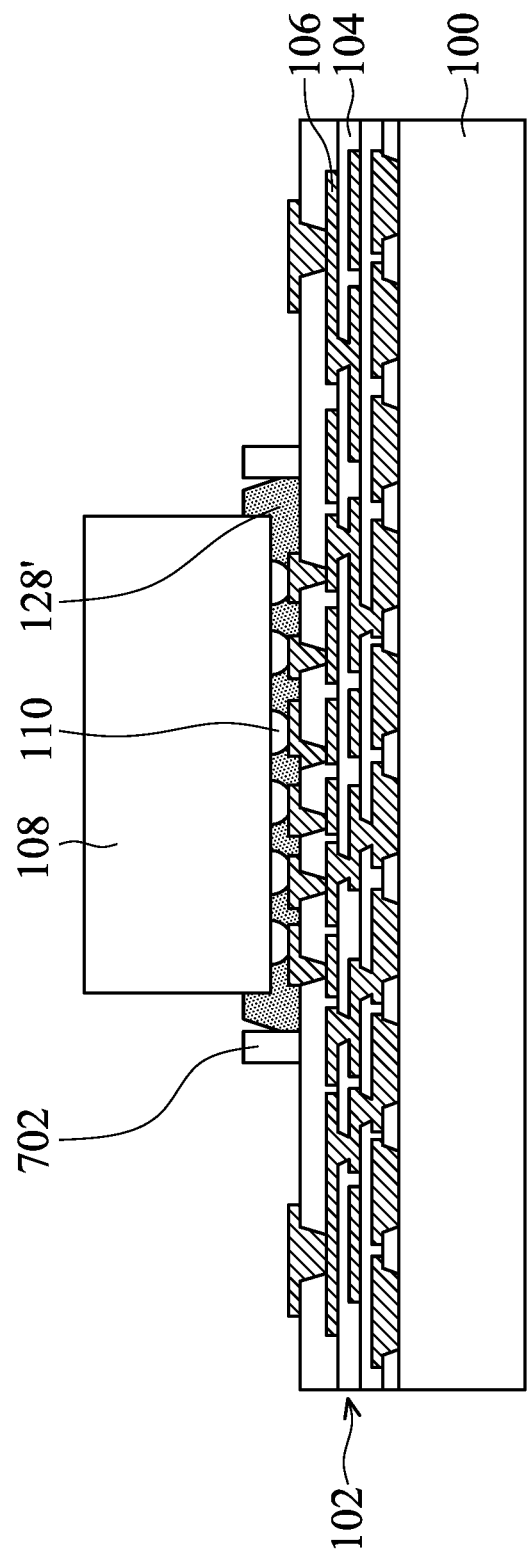

As shown in FIG. 7C, an underfill layer 128' is formed between the semiconductor die 108 and the interconnection structure 102 to protect the bonding structures 110, in accordance with some embodiments. The materials and formation methods of the underfill layer 128' may be the same as or similar to those of the underfill layer 128 illustrated in FIG. 1D. In some embodiments, due to the blocking element 702, the material (such as a liquid polymer material) used for forming the underfill layer 128' is confined within the surrounded area. Some of the conductive features 106 are prevented from being covered by the underfill layer 128', which facilitate subsequent bonding processes.

Figure 7D:
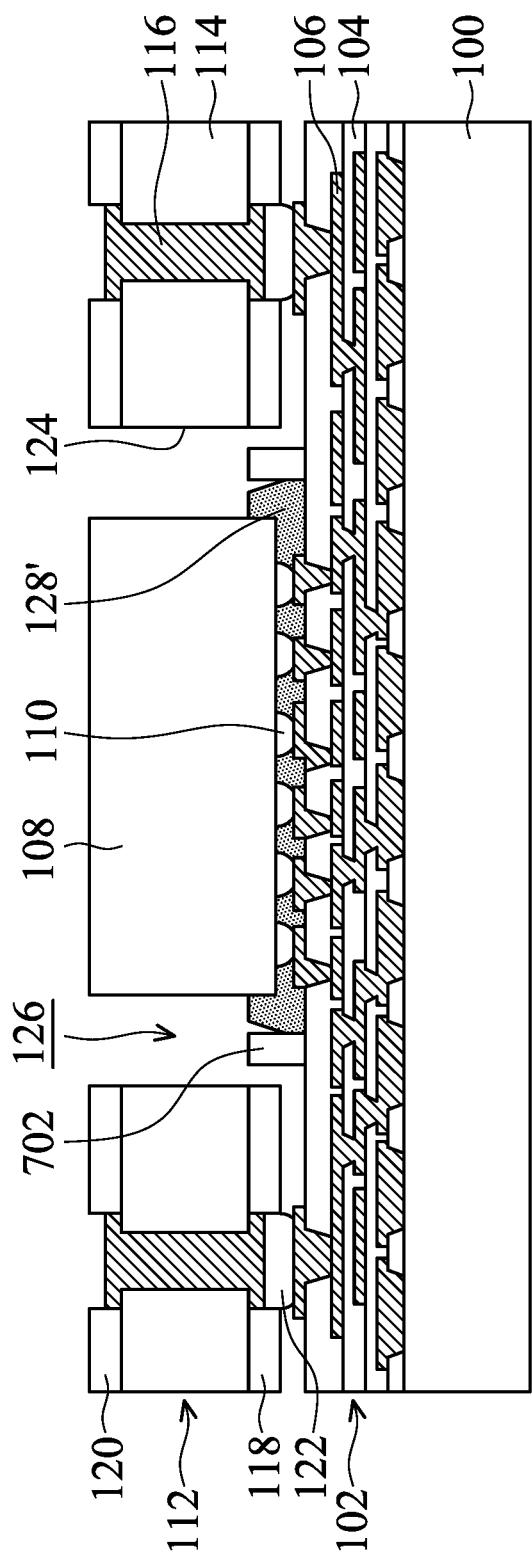

As shown in FIG. 7D, similar to the embodiments illustrated in FIG. 1C, the interposer substrate 112 is disposed over the interconnection structure 102, in accordance with some embodiments. The interposer substrate 112 may be bonded to the interconnection structure 102 through the bonding structures 122. Because the underfill layer 128' is blocked by the blocking element 702 without covering the exposed conductive features 106, the formation of the bonding structures 122 is easier to perform.

Figure 9:
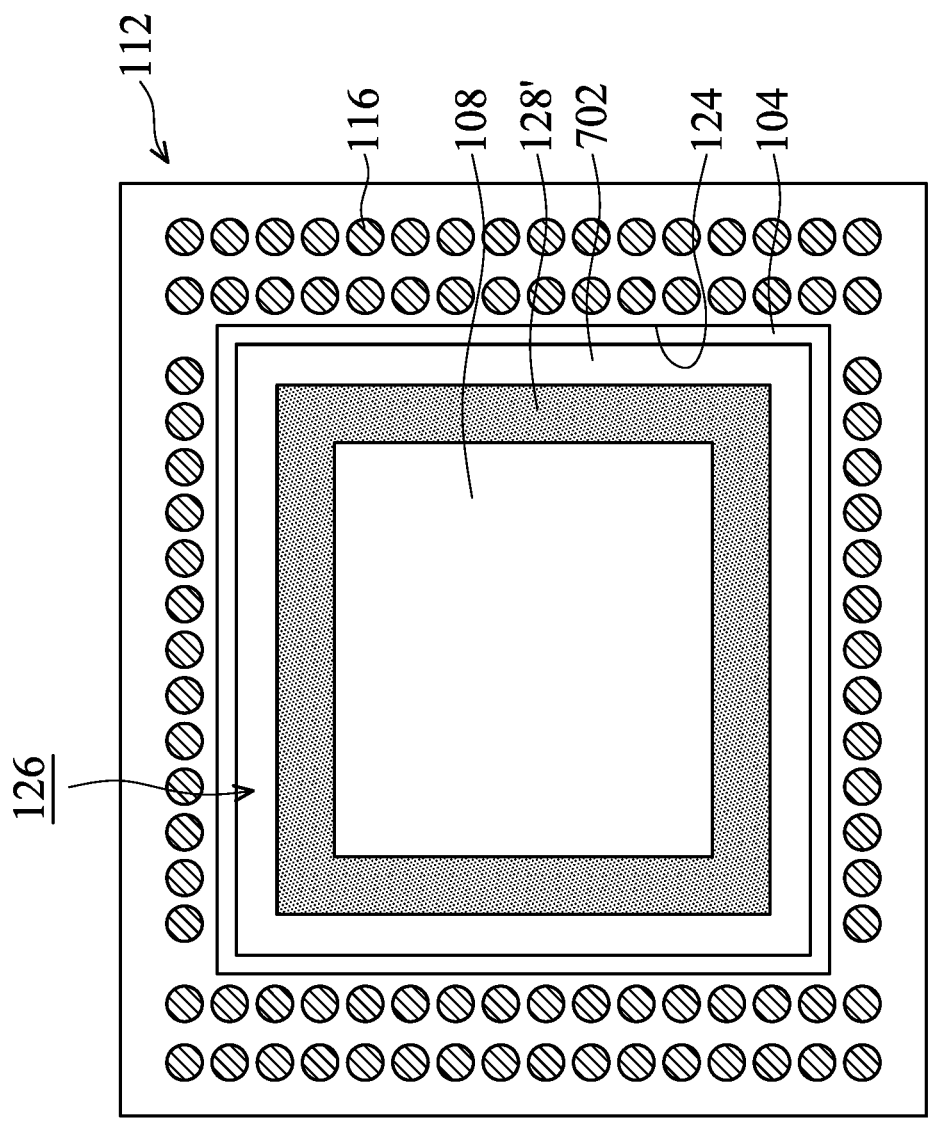
FIG. 9 is a top view of a stage of a process for forming a chip package, in accordance with some embodiments.

FIG. 9 is a top view of a stage of a process for forming a chip package, in accordance with some embodiments. In some embodiments, FIG. 9 shows the top view of the structure shown in FIG. 7D. The interior sidewalls 124 of the interposer substrate 112 surround the recess 126. The recess 126 surrounds the semiconductor die 108. The recess 126 also exposes the underfill layer 128', the blocking element 702, and interconnection structure 102. As shown in FIG. 9, the blocking element 702 is a ring structure that surrounds the semiconductor die 108. The underfill layer 128' is confined within the area surrounded by the blocking element 702. The blocking element 702 may also be formed in the embodiments illustrated in FIGS. 1, 2, 3, 4, 5, and/or 6.

Figure 7E:
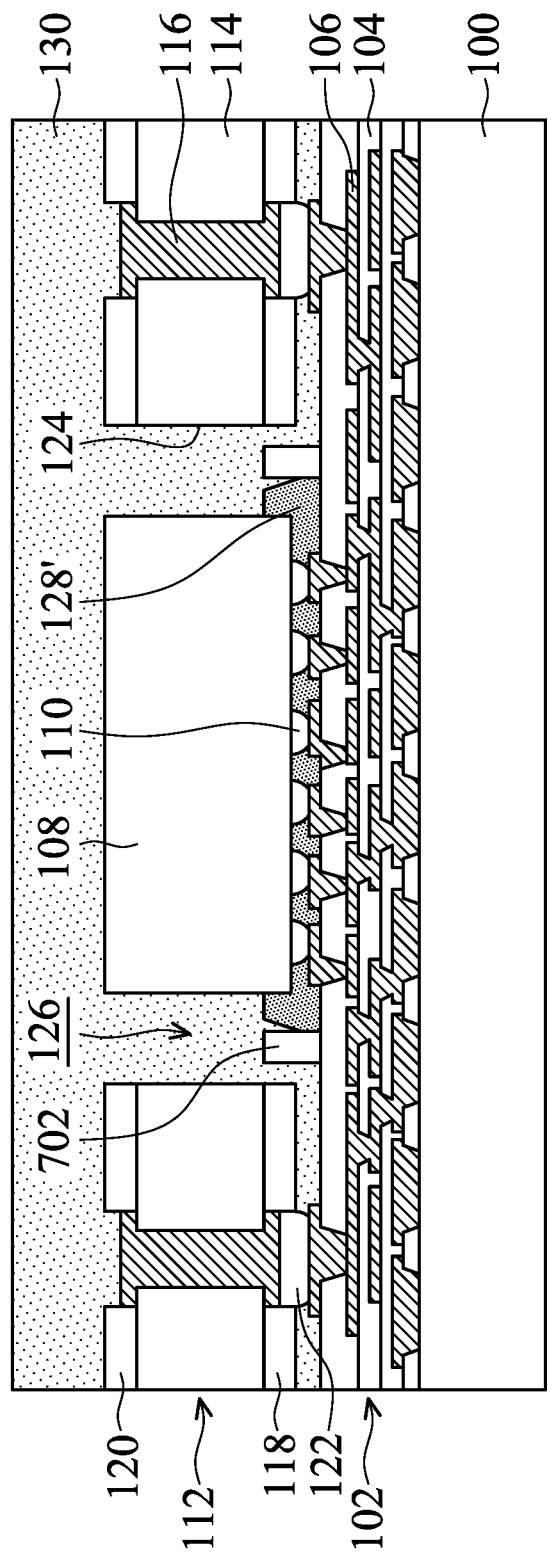
Figure 7F:
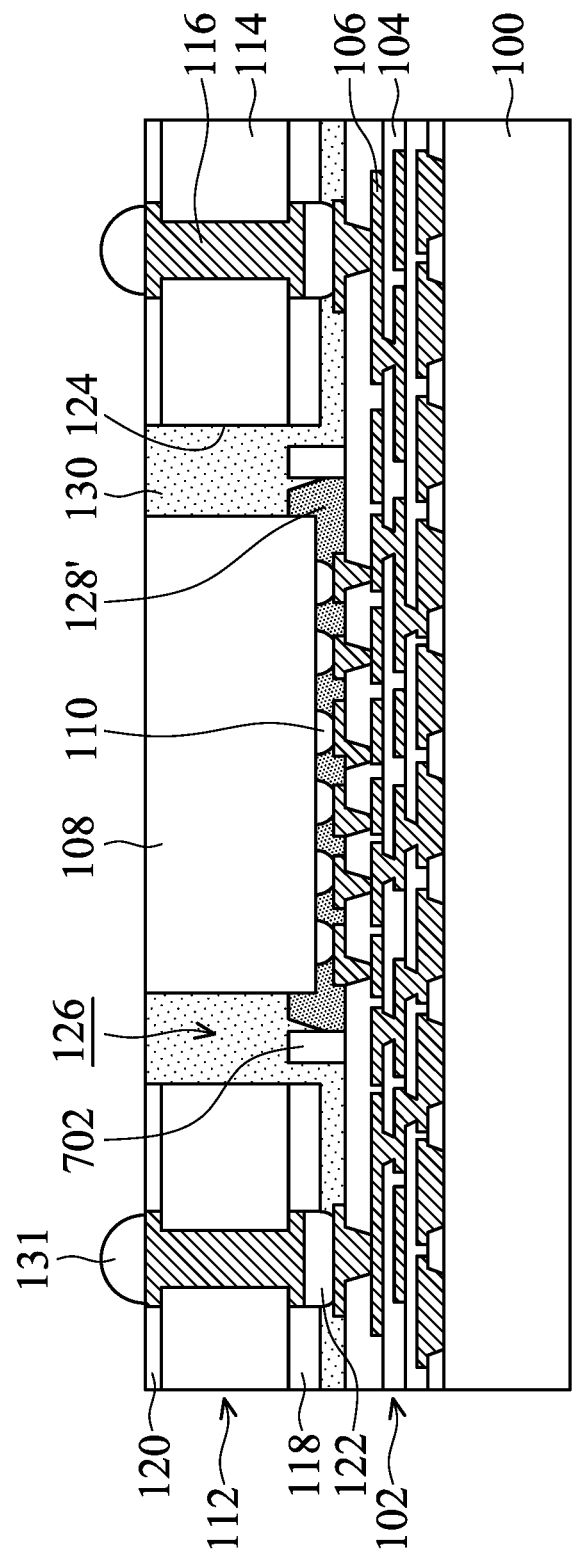

As shown in FIG. 7E, similar to the embodiments illustrated in FIG. 1E, the protective layer 130 is formed, in accordance with some embodiments. Afterwards, similar to the embodiments illustrated in FIG. 1F, the protective layer 130 is thinned to expose the conductive features 116, as shown in FIG. 7F in accordance with some embodiments. In some other embodiments, the protective layer 130 is formed using an exposed molding process or a dispensing process. In the exposed molding process, the conductive features 116 are protected by a mold during the injecting of molding compound material for forming the protective layer 130. The protective layer would not cover the conductive features 116. In these cases, the thinning process may not be needed since the conductive features 116 have been exposed. The conductive elements 131 are then formed on the exposed conductive features 116.

Figure 7G:
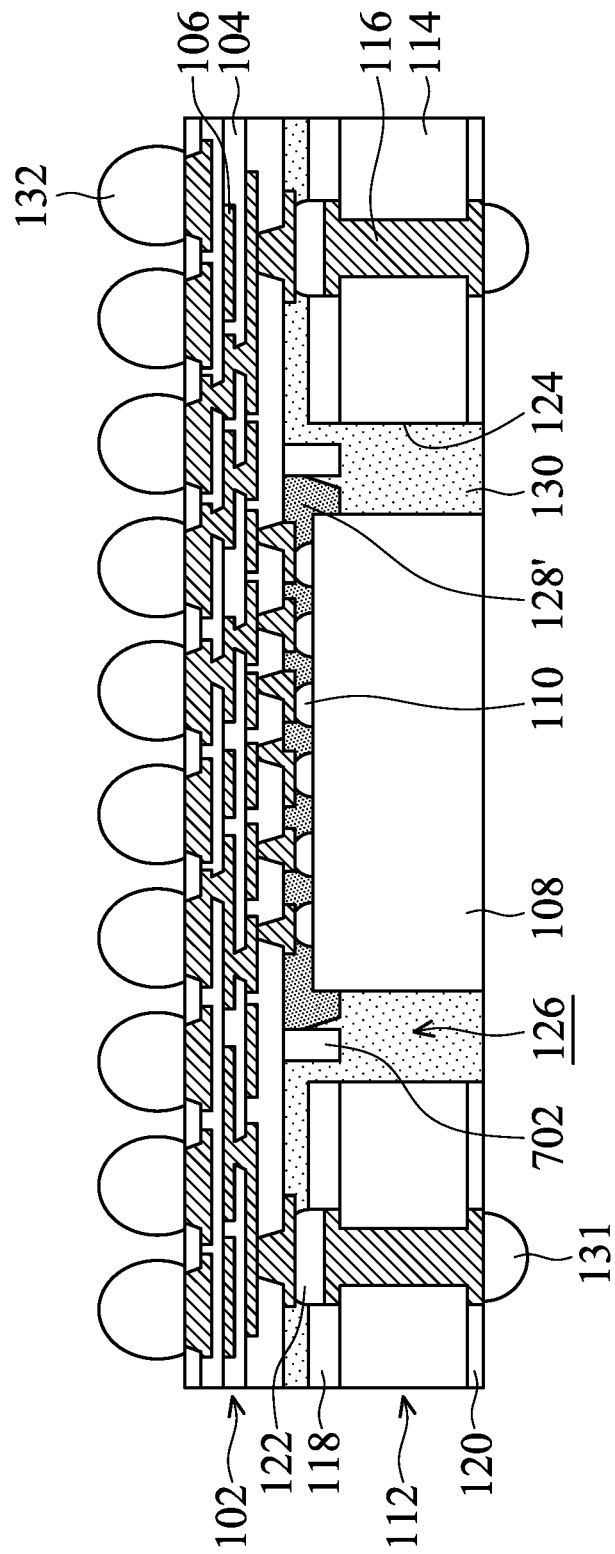

As shown in FIG. 7G, similar to the embodiments illustrated in FIGS. 1G-1H, the carrier substrate 100 is removed, and the conductive elements 132 are formed, in accordance with some embodiments.

Figure 7H:
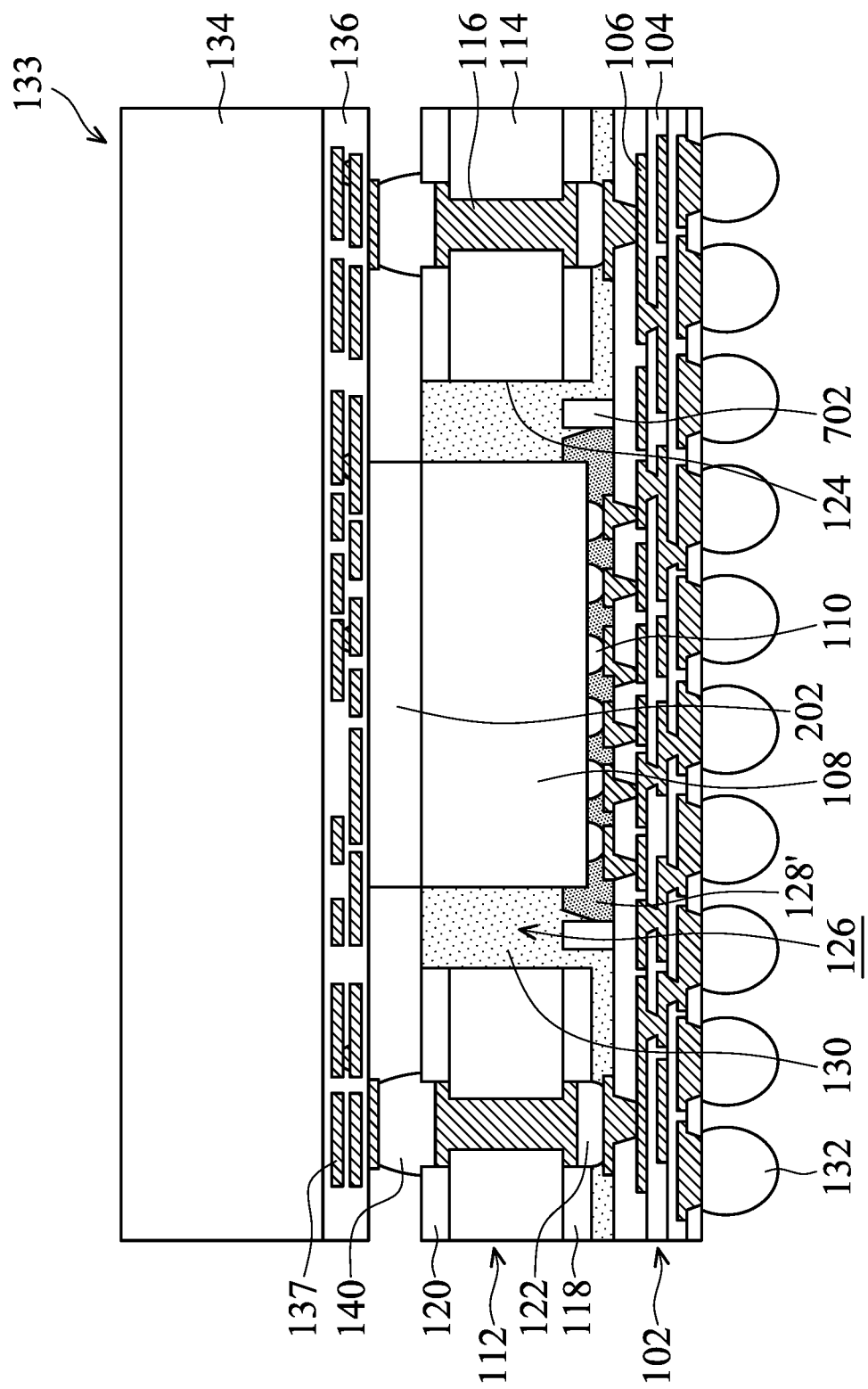

As shown in FIG. 7H, similar to the embodiments illustrated in FIGS. 1I and 1J, the package structure 133 is bonded to the interposer substrate 112 through the bonding structures 140, in accordance with some embodiments. In some embodiments, similar to the embodiments illustrated in FIG. 2C, the adhesive layer 202 is formed to improve the adhesion between the semiconductor die 108 and the package structure 133. In some embodiments, the adhesive layer 202 is made of or includes one or more materials with high thermal conductivity. In some embodiments, the adhesive layer 202 with high thermal conductivity has an area as large as that of the top surface of the semiconductor die 108. Therefore, heat generated during the operation of the device elements in the semiconductor die 108 may be led out more efficiently. In some embodiments, the area of the adhesive layer 202 with high thermal conductivity is larger than that of the top surface of the semiconductor die 108. Therefore, it is ensured that the top surface of the semiconductor die 108 is fully covered by the adhesive layer 202.

However, embodiments of the disclosure are not limited thereto. In some other embodiments, the adhesive layer 202 is not formed.

Figure 7I:
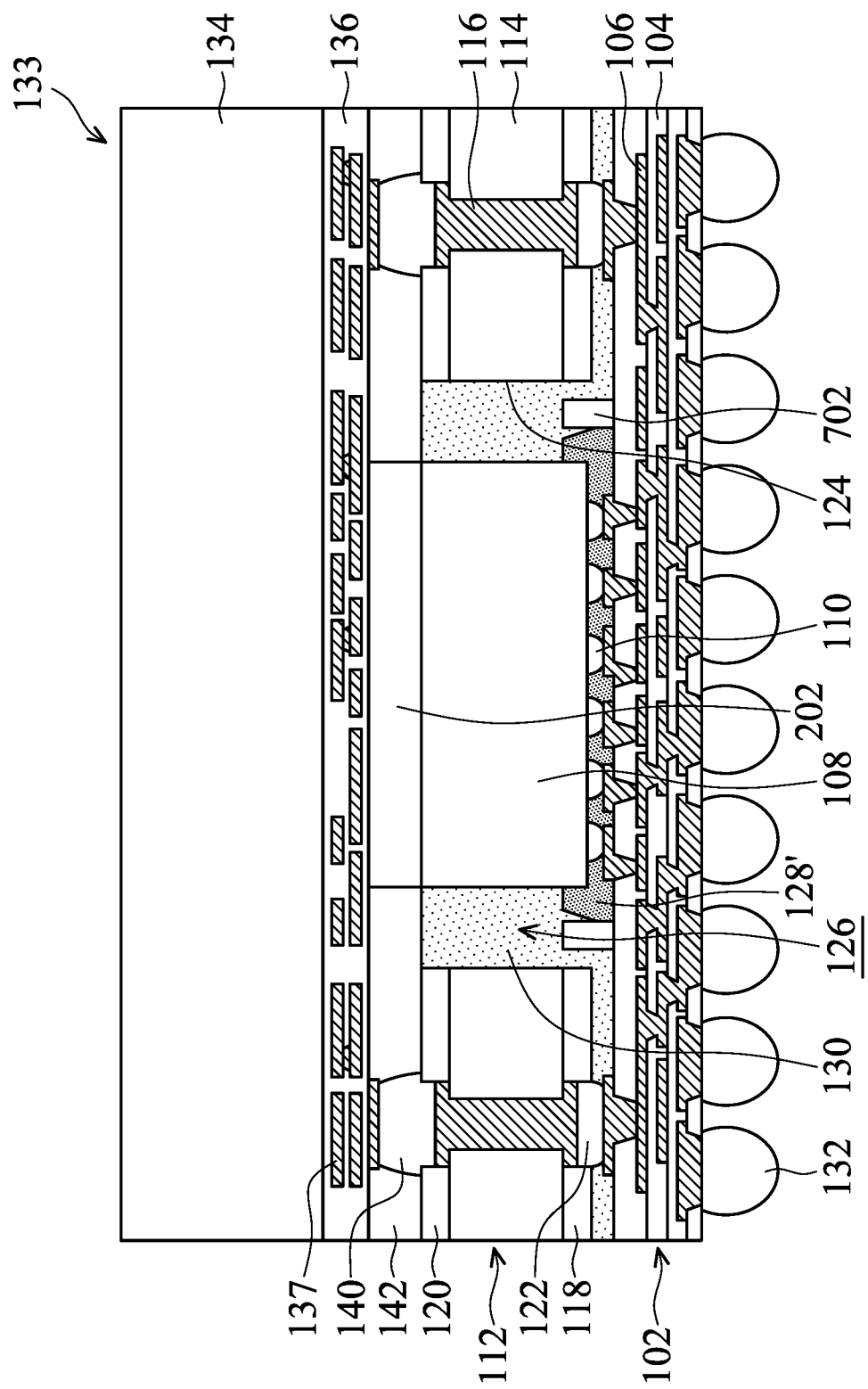

As shown in FIG. 7I, similar to the embodiments illustrated in FIG. 1K, the underfill layer 142 is formed to protect the bonding structures 140.

Many variations and/or modifications can be made to embodiments of the disclosure. In some embodiments, multiple semiconductor dies may be picked and placed onto the conductive features 106 exposed by the same recess 126.

Figure 10:
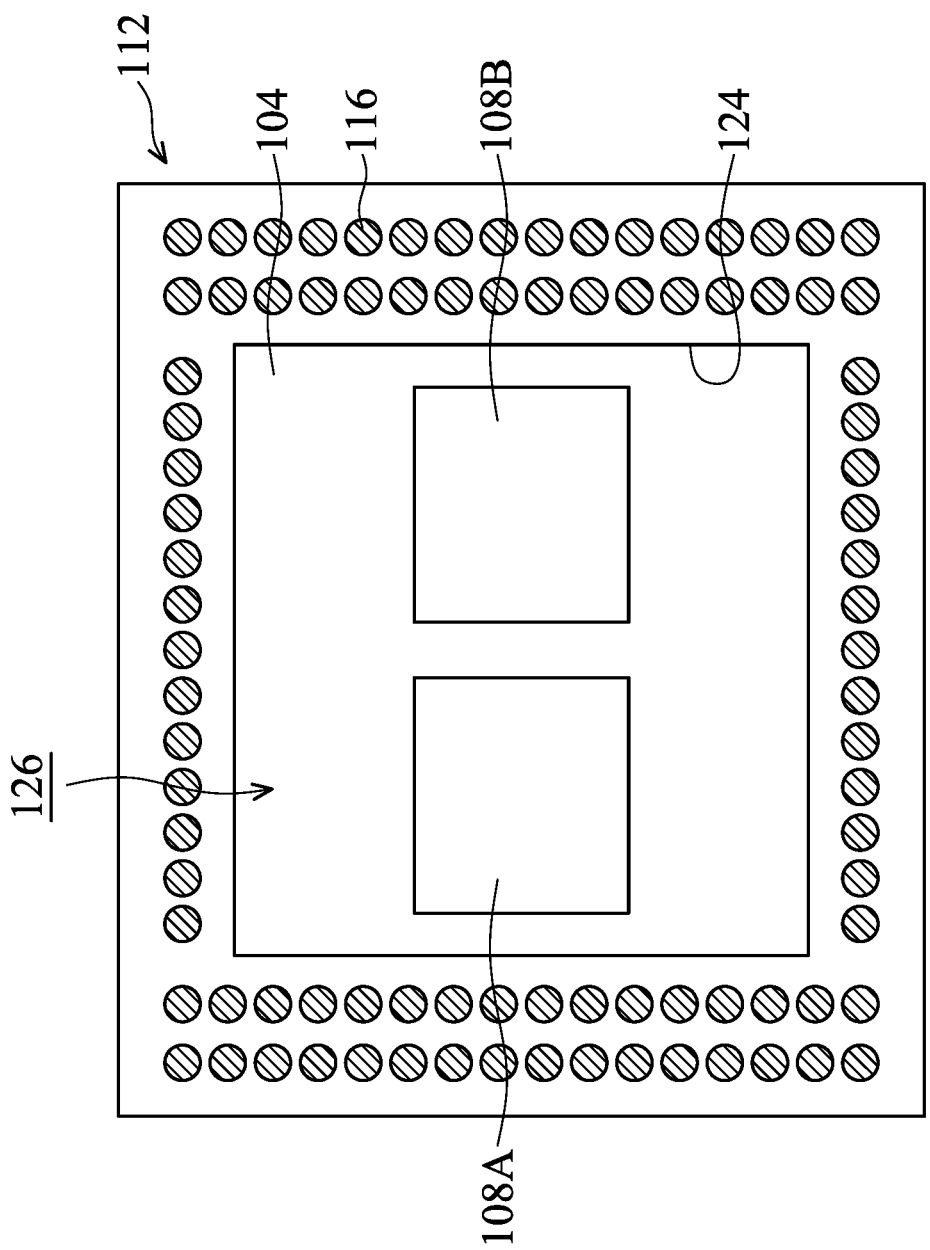
FIG. 10 is a top view of a stage of a process for forming a chip package, in accordance with some embodiments.

FIG. 10 is a top view of a stage of a process for forming a chip package, in accordance with some embodiments. In some embodiments, FIG. 10 shows the top view of the embodiments illustrated in FIGS. 1, 2, 3, 4, 5, 6, and/or 7. In some embodiments, two or more semiconductor dies (such as semiconductor dies 108A and 108B) are surrounded by the interior sidewalls of the interposer substrate 112. In some other embodiments, one or each of the elements 108A and 108B is a semiconductor device that includes one die, multiple dies, or system-on-integrated-circuit chip device. Therefore, the reference numbers "108A and 108B" may also be used to designate semiconductor devices.

Figure 11:
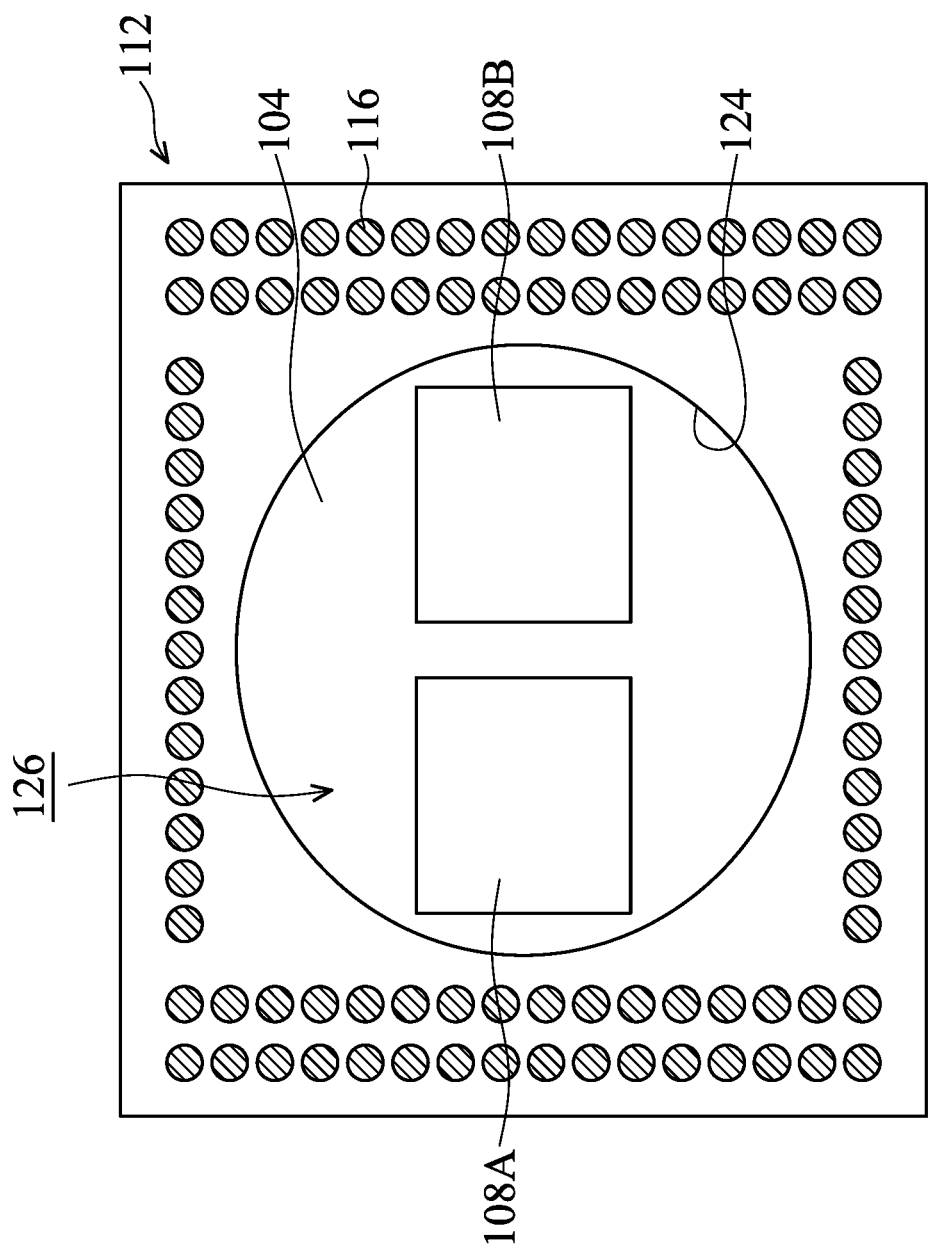
FIG. 11 is a top view of a stage of a process for forming a chip package, in accordance with some embodiments.

Many variations and/or modifications can be made to embodiments of the disclosure. FIG. 11 is a top view of a stage of a process for forming a chip package, in accordance with some embodiments. In some embodiments, the interior sidewalls 124 of the interposer substrate 112 surround an oval area. In some other embodiments, the area surrounded by the interior sidewalls 124 of the interposer substrate 112 may be square, circular, or the like. In some embodiments, FIG. 11 shows the top view of the embodiments illustrated in FIGS. 1, 2, 3, 4, 5, 6, and/or 7.

Many variations and/or modifications can be made to embodiments of the disclosure. For example, the interior sidewalls 124 of the interposer substrate 112 may be inclined sidewalls.

Figure 12:
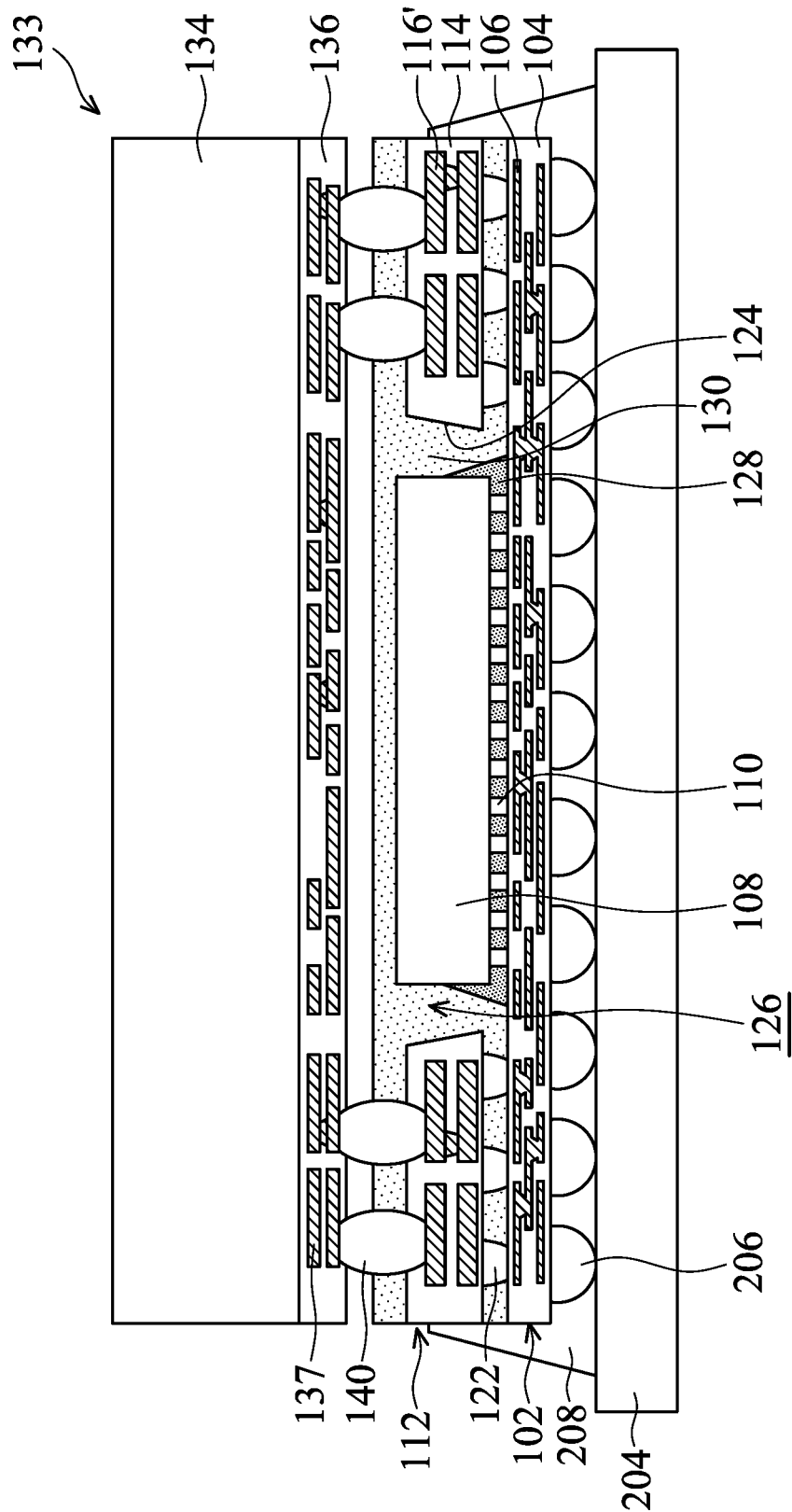
FIG. 12 is a cross-sectional view of a chip package, in accordance with some embodiments.

FIG. 12 is a cross-sectional view of a chip package, in accordance with some embodiments. As shown in FIG. 12, a structure similar to the structure shown in FIG. 4B is formed. In some embodiments, the interior sidewalls 124 are inclined sidewalls, as shown in FIG. 12. The recess 126 becomes wider along a direction from the bottom to the top of the interposer substrate 112. The interior sidewalls 124 in each of the embodiments illustrated in FIGS. 1-7 may be modified to be inclined sidewalls.

Figure 13:
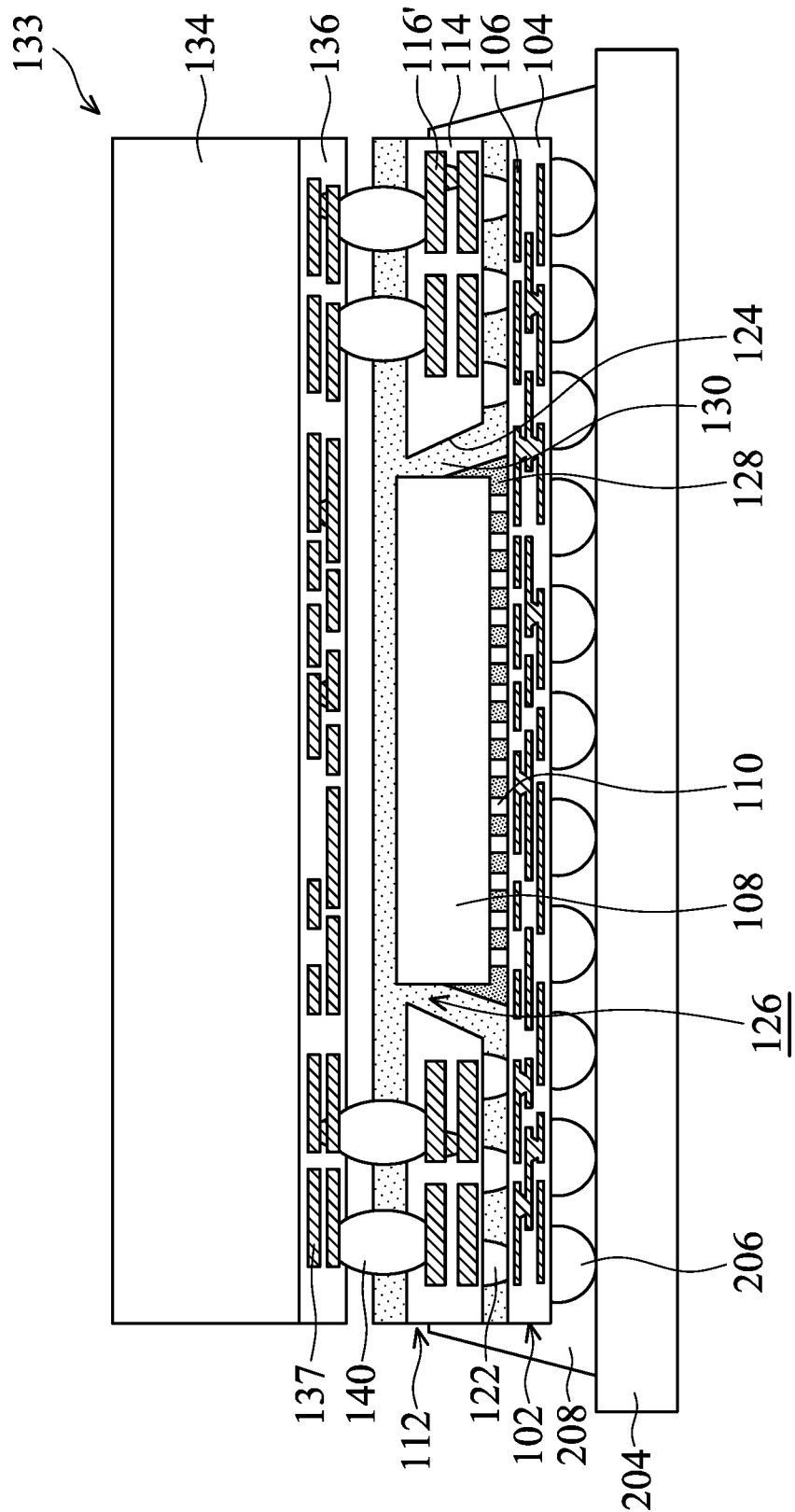
FIG. 13 is a cross-sectional view of a chip package, in accordance with some embodiments.

FIG. 13 is a cross-sectional view of a chip package, in accordance with some embodiments. As shown in FIG. 13, a structure similar to the structure shown in FIG. 4B is formed. In some embodiments, the interior sidewalls 124 are inclined sidewalls, as shown in FIG. 13. The recess 126 becomes narrower along a direction from the bottom to the top of the interposer substrate 112.

Embodiments of the disclosure form a chip package with an interposer substrate. The interposer substrate and a semiconductor die are bonded onto a redistribution structure. The interposer substrate is a ring structure that surrounds the semiconductor die. The semiconductor die is as high as or higher than the interposer substrate. The semiconductor die is not stacked on the interposer substrate and is partially surrounded by the interposer substrate. The overall height of the chip package is reduced, which facilitates subsequent bonding with other package structures.

In accordance with some embodiments, a method for forming a chip package is provided. The method includes disposing a semiconductor die over a carrier substrate. The method also includes disposing an interposer substrate over the carrier substrate. The interposer substrate has a recess that penetrates through opposite surfaces of the interposer substrate. The interposer substrate has interior sidewalls surrounding the semiconductor die, and the semiconductor die is as high as or higher than the interposer substrate. The method further includes forming a protective layer in the recess of the interposer substrate to surround the semiconductor die. In addition, the method includes removing the carrier substrate and stacking a package structure over the interposer substrate.

In accordance with some embodiments, a method for forming a chip package is provided. The method includes forming a first redistribution structure over a carrier substrate and bonding a semiconductor die to the first redistribution structure. The method also includes bonding an interposer substrate to the first redistribution structure. The interposer substrate has a ring structure surrounding the semiconductor die, and the semiconductor die is as high as or higher than the interposer substrate. The method further includes forming a protective layer to surround the semiconductor die. A portion of the protective layer is between the interposer substrate and the semiconductor die. In addition, the method includes removing the carrier substrate and bonding a package structure over the interposer substrate. The semiconductor die is between the package structure and the first redistribution structure.

In accordance with some embodiments, a chip package is provided. The chip package includes a first redistribution structure and a semiconductor die bonded on the first redistribution structure. The chip package also includes an interposer substrate bonded on the first redistribution structure. The interposer substrate has interior sidewalls surrounding the semiconductor die, and the semiconductor die is as high as or higher than the interposer substrate. The chip package further includes a protective layer surrounding the semiconductor die. In addition, the chip package includes a second redistribution structure over the protective layer. A first conductive feature of the second redistribution structure is electrically connected to a second conductive feature of the interposer substrate.

In accordance with some embodiments, a chip package is provided. The chip package includes a first redistribution structure and a semiconductor device bonded on the first redistribution structure. The chip package also includes an interposer substrate bonded on the first redistribution structure. The interposer substrate has interior sidewalls surrounding the semiconductor device, and the semiconductor device is as high as or higher than the interposer substrate. The chip package further includes a protective layer surrounding the semiconductor device and a second redistribution structure over the protective layer. A first conductive feature of the second redistribution structure is electrically connected to a second conductive feature of the interposer substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a redistribution structure, the redistribution structure including a plurality of first conductive elements and a plurality of second conductive elements, the plurality of second conductive elements having a pitch different from a pitch of the plurality of first conductive elements;
   a semiconductor chip over the redistribution structure, an active surface of the semiconductor chip facing the redistribution structure;
   an adhesive layer directly on the semiconductor chip, wherein the redistribution structure is wider than the adhesive layer;
   a plurality of conductive structures over the redistribution structure, the plurality of conductive structures being spaced apart from the semiconductor chip;
   an interposer substrate bonded to the redistribution structure through a plurality of tin-containing bonding structures, wherein a bottommost surface of the interposer substrate is spaced apart from a topmost surface of the redistribution structure; and
   a plurality of external connection terminals on and coupled to the conductive structures, the plurality of external connection terminals having a non-overlapping relationship with respect to the semiconductor chip, and the pitch of the plurality of first conductive elements being smaller than a pitch of the plurality of external connection terminals.

2. The package structure as claimed in claim 1, wherein the plurality of first conductive elements and the semiconductor chip have a non-overlapping relationship.

3. The package structure as claimed in claim 1, wherein the interposer substrate has interior sidewalls laterally surrounding the semiconductor chip, and the semiconductor chip is as high as or higher than the interposer substrate.

4. The package structure as claimed in claim 3, wherein the conductive structures are laterally surrounded by the interposer substrate.

5. The package structure as claimed in claim 3, wherein the interposer substrate is spaced apart from the semiconductor chip.

6. The package structure as claimed in claim 3, wherein the interposer substrate laterally and continuously surrounds the semiconductor chip.

7. The package structure as claimed in claim 3, further comprising a protective layer laterally surrounding the semiconductor chip, wherein the protective layer is in direct contact with the interior sidewalls of the interposer substrate.

8. The package structure as claimed in claim 1, further comprising a second semiconductor chip over the redistribution structure.

9. The package structure as claimed in claim 8, wherein the interposer substrate has interior sidewalls laterally surrounding the semiconductor chip and the second semiconductor chip.

10. The package structure as claimed in claim 1, further comprising:
    a second redistribution structure over the semiconductor chip, wherein the adhesive layer is between the semiconductor chip and the second redistribution structure.

11. The package structure as claimed in claim 10, wherein the adhesive layer is in direct contact with the semiconductor chip and the second redistribution structure, and the second redistribution structure is wider than the adhesive layer.

12. A package structure, comprising:
    a redistribution structure having a first surface and a second surface opposite to each other, the redistribution structure including a plurality of first conductive elements on the first surface;
    an interposer substrate on the second surface of the redistribution structure, a hole penetrating the interposer substrate;
    a semiconductor chip inside the hole on the second surface of the redistribution structure, an active surface of the semiconductor chip facing the redistribution structure;
    a plurality of conductive structures on the second surface of the redistribution structure, the plurality of conductive structures being spaced apart from the semiconductor chip;
    an adhesive layer directly on the semiconductor chip, wherein opposite edges of the adhesive layer is laterally between opposite edges of the redistribution structure; and
    a plurality of external connection terminals on and coupled to the conductive structures, the plurality of first conductive elements have a pitch smaller than a pitch of the plurality of external connection terminals.

13. The package structure as claimed in claim 12, wherein the conductive structures completely penetrate through the interposer substrate.

14. The package structure as claimed in claim 12, further comprising a protective layer filling the hole and laterally surrounding the semiconductor chip.

15. The package structure as claimed in claim 12, wherein the adhesive layer has an area as large as that of a top surface of the semiconductor chip.

16. The package structure as claimed in claim 12, wherein the interposer substrate is bonded to the redistribution structure through a plurality of tin-containing bonding structures, wherein a bottommost surface of the interposer substrate is spaced apart from a topmost surface of the redistribution structure.

17. A package structure, comprising:
    a redistribution structure having a first surface and a second surface opposite to each other;

a semiconductor chip on the second surface of the redistribution structure;

a plurality of conductive structures on the second surface of the redistribution structure and spaced apart from the semiconductor chip an adhesive layer directly on the semiconductor chip, wherein the redistribution structure is wider than the adhesive layer; and a plurality of external connection terminals on and coupled to the conductive structures, the plurality of external connection terminals having a non-vertically overlapping relationship with the semiconductor chip.

18. The package structure as claimed in claim 17, further comprising an interposer substrate over the redistribution structure, wherein the interposer substrate has interior sidewalls laterally surrounding an area where the semiconductor chip is disposed.

19. The package structure as claimed in claim 18, further comprising a protective layer at least partially covering the interior sidewalls and a main surface of the interposer substrate.

20. The package structure as claimed in claim 18, wherein the interposer substrate is bonded to the redistribution structure through a plurality of tin-containing bonding structures, wherein a bottommost surface of the interposer substrate is spaced apart from a topmost surface of the redistribution structure.

* * * * *